United States Patent
Jerschow et al.

(10) Patent No.: US 11,921,067 B2
(45) Date of Patent: Mar. 5, 2024

(54) SYSTEM AND METHOD FOR MAGNETIC RESONANCE MAPPING OF PHYSICAL AND CHEMICAL CHANGES IN CONDUCTING STRUCTURES

(71) Applicant: NEW YORK UNIVERSITY, New York, NY (US)

(72) Inventors: Alexej Jerschow, New York, NY (US); Andrew J. Ilott, Rahway, NJ (US); Mohaddese Mohammadi, Brooklyn, NY (US); Emilia Silletta, Cordoba (AR); Konstantin Romanenko, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 16/434,168

(22) Filed: Jun. 6, 2019

(65) Prior Publication Data
US 2019/0310211 A1    Oct. 10, 2019

Related U.S. Application Data

(63) Continuation-in-part of application No. PCT/US2017/064948, filed on Dec. 6, 2017, and a
(Continued)

(51) Int. Cl.
*G01N 24/08* (2006.01)
*G01N 24/10* (2006.01)
(Continued)

(52) U.S. Cl.
CPC .......... *G01N 24/08* (2013.01); *G01N 24/10* (2013.01); *G01R 31/3644* (2013.01); *G01R 33/5602* (2013.01); *G01R 33/5608* (2013.01)

(58) Field of Classification Search
None
See application file for complete search history.

(56) References Cited

U.S. PATENT DOCUMENTS

| 6,256,603 B1 | 7/2001 | Celniker |
| 6,774,635 B1 * | 8/2004 | Gerald, II .............. G01R 33/30 324/318 |

(Continued)

OTHER PUBLICATIONS

Baker & Verbrugge, "Temperature and Current Distribution in Thin-Film Batteries," Journal of the Electrochemical Society 146(7), pp. 2413-2424 (1999).

(Continued)

*Primary Examiner* — Nasima Monsur
(74) *Attorney, Agent, or Firm* — Foley & Lardner LLP

(57) ABSTRACT

A method of diagnosing a conducting structure includes providing the conducting structure in a magnetic field, immersing the conducting structure in a detection medium, or placing a detection medium in the vicinity of the conducting structure, exciting nuclear or electronic spins within the detection medium using a broad-band excitation pulse, receiving an NMR or ESR spectrum from the detection medium, obtaining a frequency distribution of the detection medium, and indirectly measuring internal characteristics of the conducting structure by characterizing frequency changes in the frequency distribution. Conducting structures are analyzed on the basis of changes in magnetic susceptibilities and internal electric current distributions, which may change over the course of a charging/discharging cycle, and a result of degradation and failure of the conducting structure. The conducting structure may be, for example, a battery, a capacitor, a supercapacitor, a fuel cell, or a catalyst material.

18 Claims, 25 Drawing Sheets

Related U.S. Application Data continuation-in-part of application No. 15/785,284, filed on Oct. 16, 2017, now Pat. No. 10,712,297, said application No. 15/785,284 is a continuation-in-part of application No. PCT/US2016/027624, filed on Apr. 14, 2016.

(60) Provisional application No. 62/431,075, filed on Dec. 7, 2016, provisional application No. 62/149,159, filed on Apr. 17, 2015.

(51) Int. Cl.
    *G01R 31/36* (2020.01)
    *G01R 33/56* (2006.01)

(56) References Cited

U.S. PATENT DOCUMENTS

| | | | |
|---|---|---|---|
| 7,659,124 B2* | 2/2010 | Pusiol | G01R 33/441 324/309 |
| 2006/0071662 A1* | 4/2006 | Xiang | G01Q 30/02 324/316 |
| 2006/0291364 A1 | 12/2006 | Kozicki | |
| 2007/0027532 A1* | 2/2007 | Wang | A61F 2/82 623/1.44 |
| 2007/0287184 A1* | 12/2007 | Telkki | G01R 33/44 436/57 |
| 2007/0299628 A1 | 12/2007 | Sun | |
| 2008/0231281 A1 | 9/2008 | Fain et al. | |
| 2009/0066331 A1* | 3/2009 | Marble | G01N 24/08 324/318 |
| 2010/0156414 A1* | 6/2010 | Sakellariou | G01R 33/307 324/309 |
| 2011/0160563 A1 | 6/2011 | Glogau et al. | |
| 2013/0088204 A1 | 4/2013 | Khare et al. | |
| 2013/0093428 A1 | 4/2013 | Tinnemeyer | |
| 2014/0184224 A1 | 7/2014 | Nevo et al. | |
| 2014/0232391 A1* | 8/2014 | Kadayam Viswanathan | G01V 3/32 324/309 |
| 2014/0266202 A1* | 9/2014 | Rozenfeld | G01R 33/44 324/310 |
| 2016/0116540 A1* | 4/2016 | Zheng | H01M 12/08 429/405 |

OTHER PUBLICATIONS

Chang, et al., "Correlating Microstructural Lithium Metal Growth with Electrolyte Salt Depletion in Lithium Batteries Using 7Li MRI," Journal of the American Chemical Society 137(48), pp. 15209-15216 (2015).
Cheng, et al., "Visualization of Lithium Plating and Stripping via in Operando Transmission X-ray Microscopy," The Journal of Physical Chemistry C 121(14), pp. 7761-7766 (2017).
Chernova, et al., "Layered LixNiyMnyCo1-2yO2 Cathodes for Lithium Ion Batteries: Understanding Local Structure via Magnetic Properties," Chemistry of Materials 19(19), pp. 4682-4693 (2007).
Davies, et al., "State of Charge and State of Health Estimation Using Electrochemical Acoustic Time of Flight Analysis," Journal of The Electrochemical Society 164(12), pp. A2746-A2755 (2017).
Finegan, et al., "In-operando high-speed tomography of lithium-ion batteries during thermal runaway," Nature Communications 6, 6924, 10 pages (2015).
Halpern-Manners, et al., "Magnetic resonance imaging of oscillating electrical currents," Proceedings of the National Academy of Sciences 107(19), pp. 8519-8524 (2010).
Hertz, et al., "Magnetism and structure of LixCoO2 and comparison to NaxCoO2," Physical Review B 77(7), pp. 75119-75131 (2008).
Hsieh, et al., "Electrochemical-acoustic time of flight: in operando correlation of physical dynamics with battery charge and health," Energy & Environmental Science 8, pp. 1569-1577 (2015).
Ilott & Jerschow, "Super-resolution Surface Microscopy of Conductors using Magnetic Resonance," Scientific Reports 7, 5425, 7 pages (2017).
Ilott, et al., "Multinuclear in situ magnetic resonance imaging of electrochemical double-layer capacitors," Nature Communications 5, 4536, 6 pages (2014).
Ilott, et al., "Real-time 3D imaging of microstructure growth in battery cells using indirect MRI," Proceedings of the National Academy of Sciences 113(39), pp. 10779-10784 (2016).
Ilott, et al., "Rechargeable lithium-ion cell state of charge and defect detection by in-situ inside-out magnetic resonance imaging," Nature Communications 9, 1776, 7 pages (2018).
Ilott, et al., "Visualizing skin effects in conductors with MRI: 7Li MRI experiments and calculations," Journal of Magnetic Resonance 245, pp. 143-149 (2014).
International Search Report and Written Opinion for PCT/US2016/027624, dated Aug. 19, 2016, 11 pages.
International Search Report and Written Opinion in PCT/US2017/064948, dated Feb. 28, 2018, 10 pages.
Johansen, et al., "Direct observation of the current distribution in thin superconducting strips using magneto-optic imaging," Physical Review B 54, 16264, 6 pages (1996).
Joy, et al., "Imaging of current density and current pathways in rabbit brain during transcranial electrostimulation," IEEE Transactions on Biomedical Engineering 46(9), pp. 1139-1149 (1999).
Joy, et al., "In vivo detection of applied electric currents by magnetic resonance imaging," Magnetic Resonance Imaging 7(1), pp. 89-94 (1989).
Kadyk, et al., "Magnetic susceptibility as a direct measure of oxidation state in LiFePO4 batteries and cyclic water gas shift reactors," Physical Chemistry Chemical Physics 17(30), pp. 19834-19843 (2015).
Lim, et al., "Origin and hysteresis of lithium compositional spatiodynamics within battery primary particles," Science 353(6299), pp. 566-571 (2016).
Liu, et al., "Visualization of Charge Distribution in a Lithium Battery Electrode," The Journal of Physical Chemistry Letters 1(14), pp. 2120-2123 (2010).
Manassen, et al., "Mapping of electrical circuits using chemical-shift imaging," Journal of Magnetic Resonance 76(2), pp. 371-374 (1969).
Morcrette, et al., "In situ X-ray diffraction techniques as a powerful tool to study battery electrode materials," Electrochimica Acta 47(19), pp. 3137-3149 (2002).
Neimoller, et al., "EPR Imaging of Metallic Lithium and its Application to Dendrite Localisation in Battery Separators," Scientific Reports 8, 14331, 7 pages (2018).
Panitz, et al., "Raman Microscopy Applied to Rechargeable Lithium-Ion Cells-Steps towards in situ Raman Imaging with Increased Optical Efficiency," Applied Spectroscopy 55(9), pp. 1131-1137 (2001).
Paxton, et al., "Tracking inhomogeneity in high-capacity lithium iron phosphate batteries," Journal of Power Sources 275, pp. 429-434 (2015).
Petibon, et al., "Study of Electrolyte Additives Using Electrochemical Impedance Spectroscopy on Symmetric Cells," Journal of the Electrochemical Society 160(1), pp. A117-A124 (2013).
Robinson, et al., "A Method for Unwrapping Highly Wrapped Multi-echo Phase Images at Very High Field: UMPIRE," Magnetic Resonance in Medicine 72(1), pp. 80-92 (2014).
Salomir, et al., "A Fast Calculation Method for Magnetic Field Inhomogeneity due to an Arbitrary Distribution of Bulk Susceptibility," Concepts in Magnetic Resonance 19B(1), pp. 26-34 (2003).
Samba, et al., "Impact of Tab Location on Large Format Lithium-Ion Pouch Cell Based on Fully Coupled Tree-Dimensional Electrochemical-Thermal Modeling," Electrochimica Acta 147, pp. 319-329 (2014).
Sathiya, et al., "Electron paramagnetic resonance imaging for real-time monitoring of Li-ion batteries," Nature Communications 6, 6276, (2015).
Shin, et al., "Initial study on in vivo conductivity mapping of breast cancer using MRI," Journal of Magnetic Resonance Imaging 42(2), pp. 371-378 (2015).

(56) References Cited

OTHER PUBLICATIONS

Taheri, et al., "Theoretical Analysis of Potential and Current Distributions in Planar Electrodes of Lithium-ion Batteries," Electrochimica Acta 133, pp. 197-208 (2014).

Taminato, et al., "Real-time observations of lithium battery reactions—operando neutron diffraction analysis during practical operation," Scientific Reports 6, 28843, 12 pages (2016).

Tang, et al., "Non-Destructive Monitoring of Charge-Discharge Cycles on Lithium Ion Batteries using 7Li Stray-Field Imaging," Scientific Reports 3, 2596, 6 pages (2013).

Tuch, et al., "Conductivity tensor mapping of the human brain using diffusion tensor MRI," Proceedings of the National Academy of Sciences 98(20), pp. 11697-11701 (2001).

Van Lier, et al., "B Phase mapping at 7 T and its application for in vivo electrical conductivity mapping," Magnetic Resonance in Medicine 67(2), pp. 552-561 (2012).

Wandt, et al., "Operando electron paramagnetic resonance spectroscopy—formation of mossy lithium on lithium anodes during charge-discharge cycling," Energy & Environmental Science 8, pp. 1358-1367 (2015).

Wood, et al., "Dendrites and Pits: Untangling the Complex Behavior of Lithium Metal Anodes through Operando Video Microscopy," ACS Central Science 2(11), pp. 790-801 (2016).

Zhang, et al., "Effects of Non-Uniform Current Distribution on Energy Density of Li-Ion Cells," Journal of the Electrochemical Society 160(11), pp. A2299-A2305 (2013).

Zhang, et al., "Imaging Electric Properties of Biological Tissues by RF Field Mapping in MRI," IEEE Transactions on Medical Imaging 29(2), pp. 474-481 (2010).

Zhang, et al., "In-Situ Measurement of Current Distribution in a Li-Ion Cell," Journal of the Electrochemical Society 160(4), pp. A610-A615 (2013).

\* cited by examiner

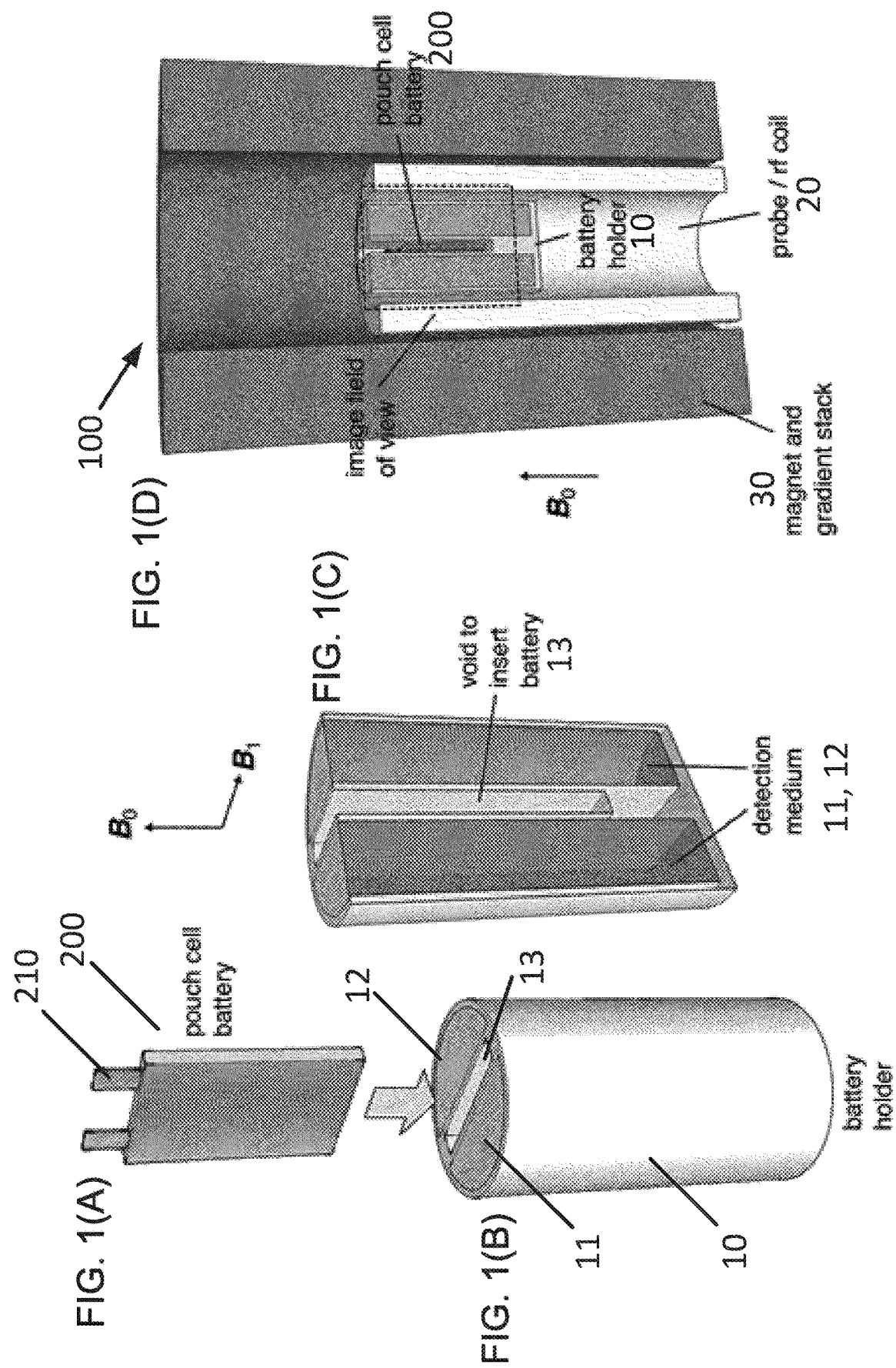

RIT cell

Commercial cell

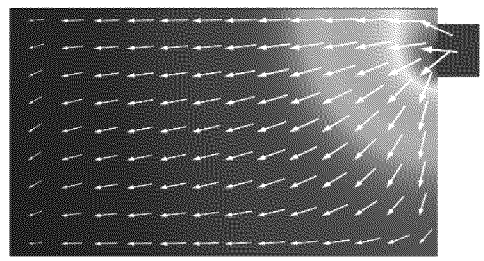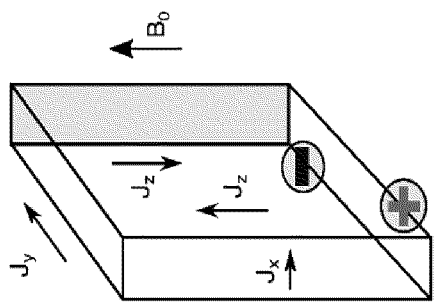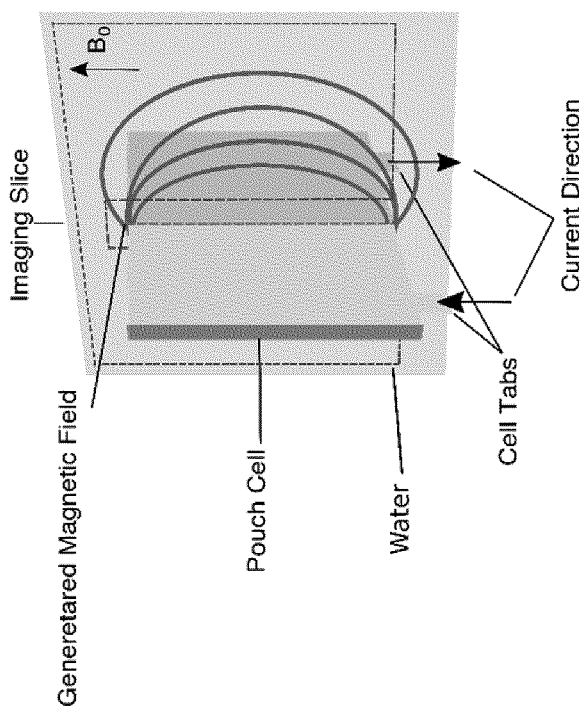

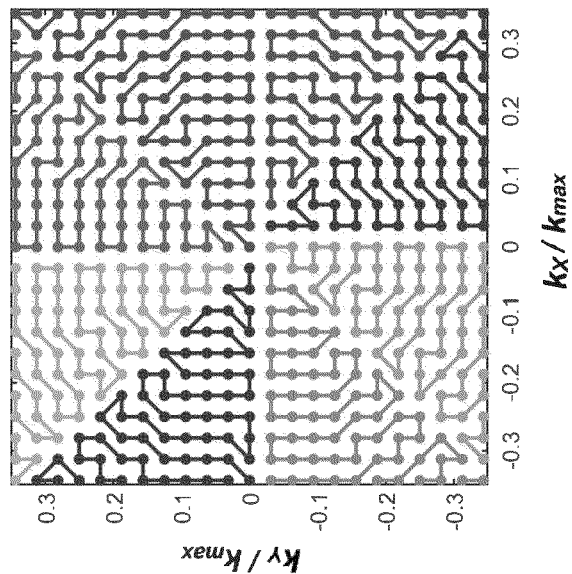
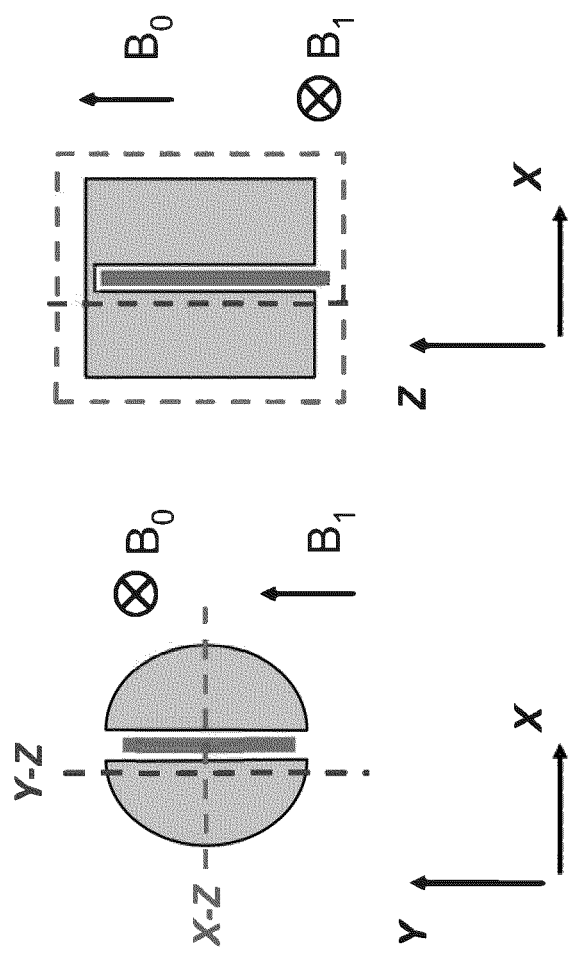

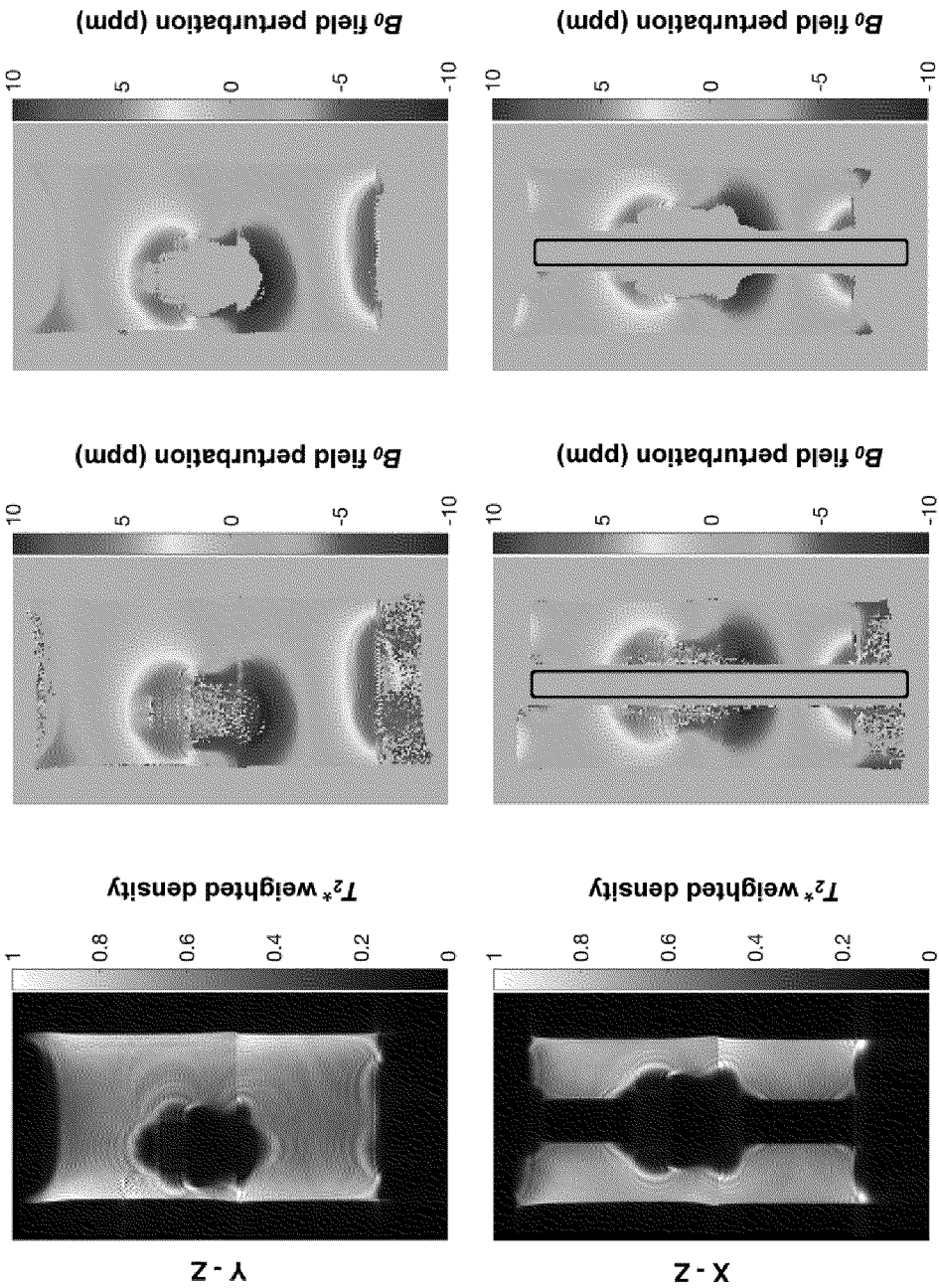

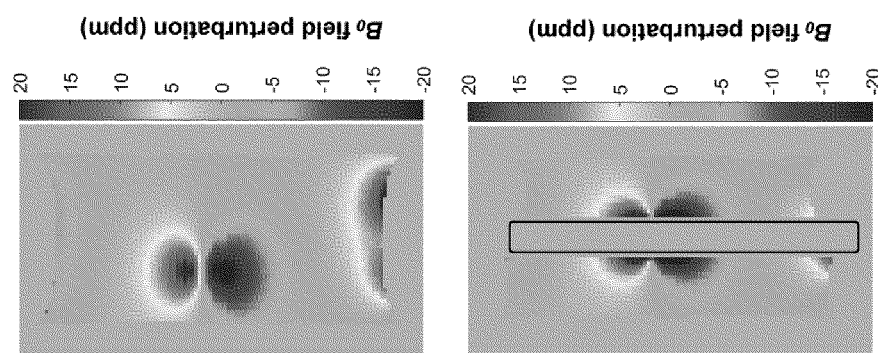
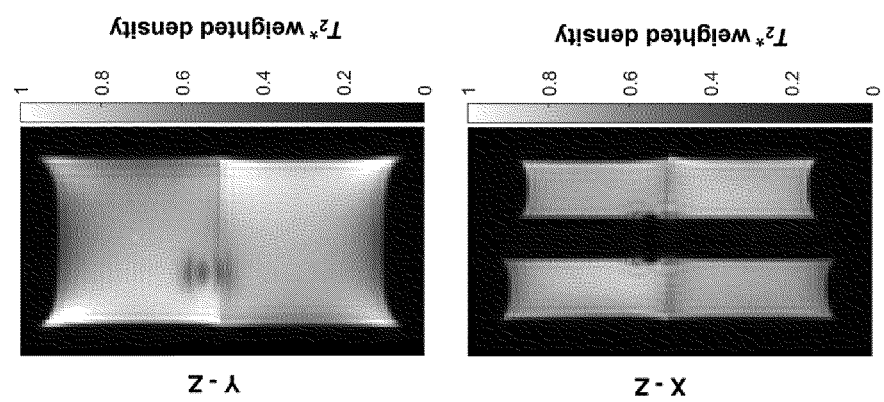

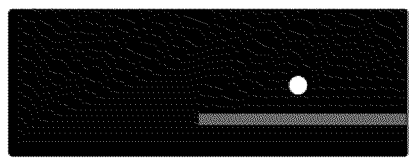
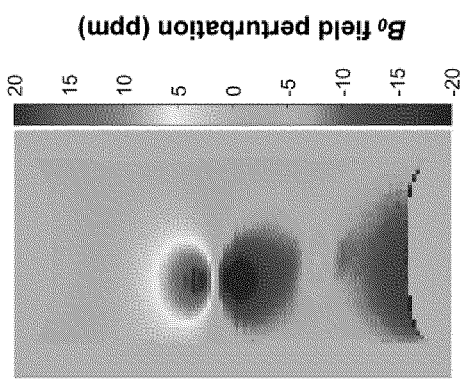
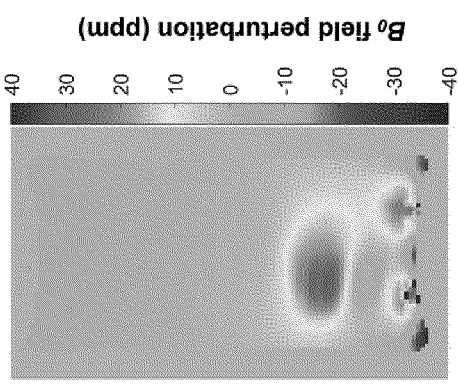
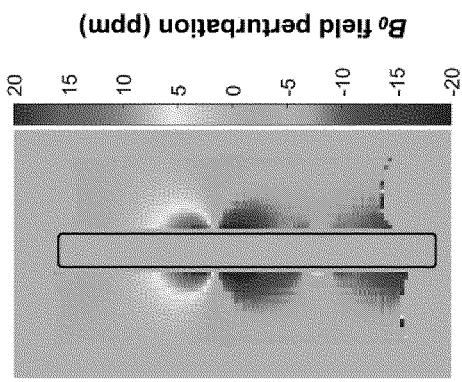
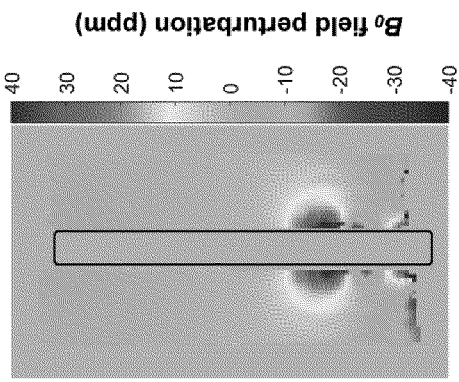
FIG. 22(A)
FIG. 22(B)

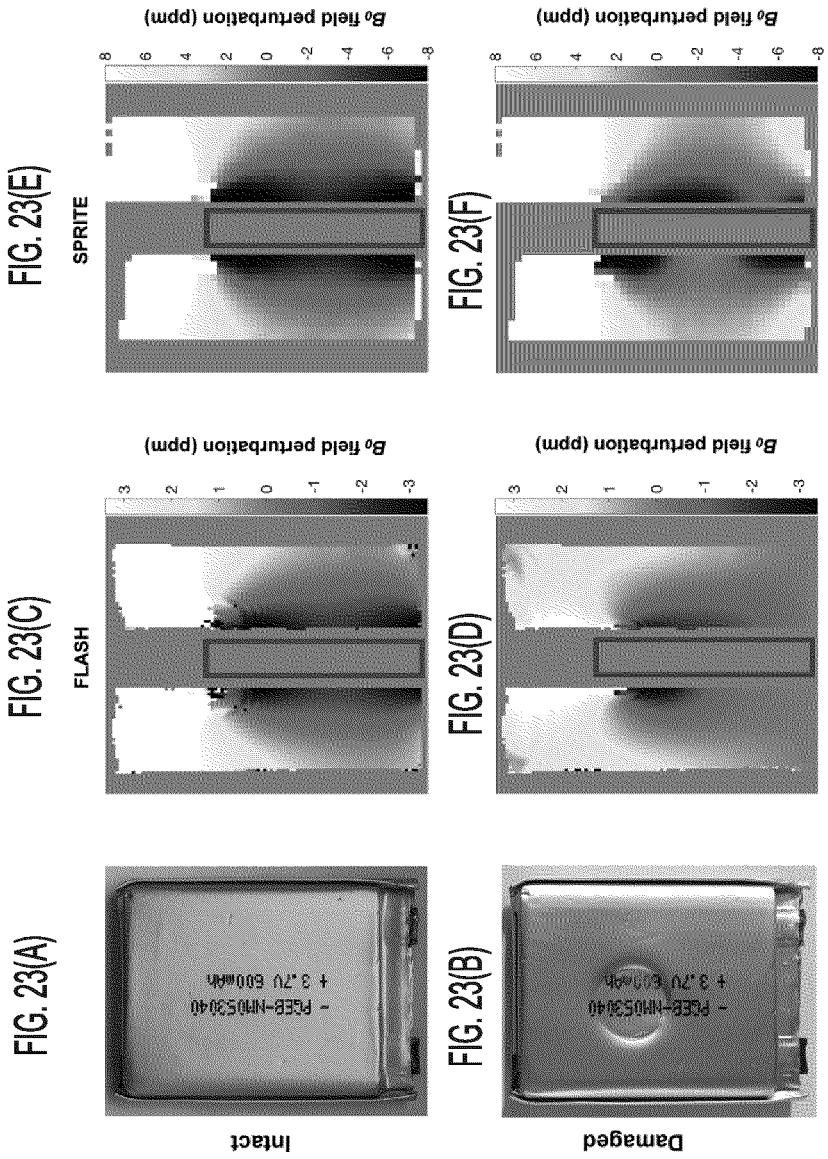

SYSTEM AND METHOD FOR MAGNETIC RESONANCE MAPPING OF PHYSICAL AND CHEMICAL CHANGES IN CONDUCTING STRUCTURES

CROSS-REFERENCE TO RELATED APPLICATIONS

This application is a continuation-in-part of International Application No. PCT/US2017/064948 filed Dec. 6, 2017, which claims priority to U.S. Provisional Application No. 62/431,075 filed Dec. 7, 2016; and this application is a continuation-in-part of U.S. patent application Ser. No. 15/785,284 filed Oct. 16, 2017, which claims priority to U.S. Provisional Application No. 62/431,075 filed Dec. 7, 2016 and is a continuation-in-part of International Application No. PCT/US2016/027624 filed Apr. 14, 2016, which claims priority to U.S. Provisional Application No. 62/149,159 filed Apr. 17, 2015. All of the above applications are incorporated herein by reference in their entirety for all purposes.

FIELD OF THE INVENTION

This application generally relates to detecting physical and chemical changes in conducting structures. In particular, this application relates to using magnetic resonance to indirectly measure internal characteristics of a conducting structure. The conducting structure may be a battery, a capacitor, a supercapacitor, a fuel cell, or a catalyst material. In the case of a battery the techniques derived herein provide the ability to determine state of charge distribution, a distribution of electrical currents, and to diagnose battery defects and failures in a non-contact fashion.

BACKGROUND OF THE INVENTION

Batteries are a crucial enabling technology in many important energy solutions and they are integral to advances in portable electronics, electric vehicles and grid storage. Continued demand for batteries with high energy capacity and the desire to quickly charge and discharge the devices present a number of formidable engineering and scientific challenges. Ensuring device safety is an important consideration, which needs to be addressed with care. Several industry leaders have experienced unforeseen setbacks due to battery and cell malfunctions (e.g., swelling issues). One major reason for the recurrence of such problems, and for the slow progress in battery technology is the difficulty in tracking defects inside the cells during operation in a non-destructive fashion.

Studying commercial battery designs under their typical operating conditions using conventional analytical tools has proven to be very difficult due to the large size, complicated structure and material properties of these devices. Due to these limitations, most studies have been restricted to specialized cell designs with properties amenable to study using specific techniques. These restrictions have meant that the investigation of performance and failure mechanisms in batteries is still performed destructively by cycling multiple cells and taking them apart at critical points to analyze changes that have occurred. This process involves considerable time, effort and expense. Moreover, physical and chemical changes occurring when the cell is taken apart can compromise any information obtained.

X-Ray CT is a successful technique for scanning electrochemical cells, but it is relatively slow, and thus usually not applicable for high throughput or in situ applications. Furthermore, X-Ray CT provides diagnostics mostly of the denser components of a cell, and does not offer insights into subtle chemical or physical changes of the materials inside. A recently-developed acoustic technique appears to be a highly promising methodology for the non-destructive characterization of cell behavior throughout the cell life, and is currently being investigated for its sensitivity to important cell behavior.

Nuclear Magnetic Resonance (NMR) and Magnetic Resonance Imaging (MRI) have become popular methods for studying battery materials. NMR and MRI are able to probe a range of physical and chemical characteristics in situ, albeit in cell housings designed specifically for the experiments.

In magnetic resonance imaging, localization is performed with the help of magnetic field gradients. Electromagnetic radiation decays exponentially when it enters a conducting region with a characteristic length, called the skin depth, $$\delta = \sqrt{\frac{1}{\pi \mu \nu \sigma}} \quad \text{(Equation 1)}$$

where $\nu$ is the frequency of the field, $\mu$ the permeability of the conductor and a its conductivity. This effect has profound implications for the sensitivity of magnetic resonance (MR) techniques, which rely on radio frequency (rf) fields to excite and detect precessing spins from within conducting regions.

A key feature Equation 1 above is the dependence on $\nu^{-1/2}$ which means that at higher frequencies (corresponding to experiments performed at higher magnetic fields) $\delta$ is reduced. For example, $\delta=12.3$ μm for nuclear spins of Lithium-7 ($^7$Li) in metallic lithium at a magnetic field of a 9.4 T (larmor frequency, $\nu_n$=155 MHz) while Lithium-6 ($^6$Li) nuclei in the same sample will have a larger effective skin depth, $\delta=20.0$ μm because of the lower gyromagnetic ratio of this isotope and therefore lower larmor frequency ($\nu_n$=59 MHz). For a corresponding electron spin transition, GHz frequencies would be relevant, and the skin depth would be in the range $\delta \approx 1$ μm.

The prospect of applying magnetic resonance techniques (e.g., NMR and MM) to commercial batteries is restricted because under typical operating conditions, conductors are not transparent to radiofrequency (rf) irradiation. Almost every cell design is encased in a conductive material, for example, solid stainless steel, aluminum, aluminum-laminated films used in pouch cells, etc. In addition, the electrodes preclude the use of conventional MR for realistic or commercial-type cell geometries. The rf fields used in typical magnetic resonance experiments are incapable of penetrating the conductive material (i.e., metallic layer) in order to excite and detect the nuclear magnetization. Nonetheless, MR has provided important insights into electrolyte behavior, Li-dendrite growth, and other electrochemical effects by the use of custom-built cells, which allow convenient rf access.

A need exists for improved technology capable of applying magnetic resonance techniques to measure physical and chemical changes in conducting structures, including batteries encased in a conductive material.

SUMMARY OF THE INVENTION

In one implementation, a method of diagnosing a conducting structure includes providing the conducting structure in a magnetic field, immersing the conducting structure in a detection medium, exciting nuclear or electronic spins within the detection medium using an electromagnetic signal having a first frequency, receiving an electromagnetic signal having a second frequency from the detection medium, obtaining a frequency distribution of the detection medium, and indirectly measuring internal characteristics of the conducting structure by characterizing frequency changes in the frequency distribution. The conducting structure may be a battery, a capacitor, a supercapacitor, a fuel cell, or a catalyst material.

In another implementation, a method of diagnosing a conducting structure includes providing the conducting structure in a magnetic field, providing a sample including a detection medium at a predetermined distance from the conducting structure, exciting nuclear or electronic spins within the detection medium using an electromagnetic signal having a first frequency, receiving an electromagnetic signal having a second frequency from the detection medium, obtaining a frequency distribution of the detection medium, and indirectly measuring internal characteristics of the conducting structure by characterizing frequency changes in the frequency distribution. The conducting structure may be a battery, a capacitor, a supercapacitor, a fuel cell, or a catalyst material.

In a further implementation, a system for diagnosing internal characteristics of a conducting structure includes an NMR/MRI magnet, at least one radiofrequency coil removably positioned within the NMR/MRI magnet, a holder configured to receive a conducting structure, and a detection medium. The internal characteristics of the conducting structure are indirectly measured by exciting nuclear or electronic spins within the detection medium using an electromagnetic signal having a first frequency, receiving an electromagnetic signal having a second frequency from the detection medium, obtaining a frequency distribution of the detection medium, and characterizing frequency changes in the frequency distribution. The conducting structure may be a battery, a capacitor, a supercapacitor, a fuel cell, or a catalyst material. The holder containing the conducting structure may be provided inside of the detection medium or at a predetermined distance outside of the detection medium.

In yet another implementation, a system for diagnosing internal characteristics of a conducting structure includes a holder configured to receive a conducting structure; a plurality of containers arranged in three dimensions around the holder and a predetermined distance from the holder, each container housing a volume of a detection medium; a plurality of radiofrequency coils, each radiofrequency coil surrounding a container; and a plurality of detection circuits, each detection circuit connected to a radiofrequency coil. Internal characteristics of the conducting structure are indirectly measured by acquiring an NMR chemical shift spectrum to estimate a change in a magnetic field in a vicinity of each container housing the detection medium to generate an overall field map and fit the overall field map against a calculated susceptibility distribution. The conducting structure may be a battery, a capacitor, a supercapacitor, a fuel cell, or a catalyst material.

BRIEF DESCRIPTION OF THE FIGURES

The foregoing and other objects, aspects, features, and advantages of the disclosure will become more apparent and better understood by referring to the following description taken in conjunction with the accompanying drawings, in which:

FIG. 1(A) illustrates a system for magnetic resonance mapping of physical and chemical changes in a battery including a poach cell battery.

FIG. 1(B) illustrates a holder that housing a detection medium and keeps the battery of FIG. 1(A) in place relative to the detection medium.

FIG. 1(C) illustrates a cross-section through the holder showing a first detection medium chamber, a second detection medium chamber, and a battery chamber.

FIG. 1(D) illustrates the battery and holder of FIGS. 1(A) and 1(B) disposed within a radiofrequency coil positioned at an isocenter of an NMR/MRI magnet. The relative orientations of the $B_0$ and $B_1$ fields are shown relative to the object geometry in (C), with $B_1$ aligned with the major face of the pouch cell.

FIG. 14(A) illustrates cell position and orientation of an imaging slice.

FIG. 14(B) illustrates current distribution elements inside the battery and cell orientation.

FIG. 14(C) illustrates calculated current and voltage distribution on the positive current collector during charging.

FIG. 19(A) illustrates transverse {x-y} and longitudinal {x-z} views of the battery holder with respect to $B_0$ and $B_1$ field directions.

FIG. 19(B) illustrates sectoral k-space trajectories with centric ordering employed in 3D-SPRITE. The $k_X$-$k_Y$ plane is divided into 8 sectors. This scheme is repeated for a number of equally spaced $k_Z$ values.

FIG. 20(A) illustrates longitudinal {y-z} and {x-z} slices through the 3D FLASH image of the battery holder containing the intact iPhone™5 battery.

FIG. 20(B) illustrates {y-z} and {x-z} slices through the 3D FLASH MF map.

FIG. 20(C) illustrates the regions of MF map in FIG. 20(B) with SNR>3. FLASH TE range: 2.45-2.8 ms.

FIG. 21(A) illustrates longitudinal {y-z} and {x-z} slices through the 3D SPRITE image of the battery holder containing the intact iPhone™-5 battery, $T_P$: 0.12 ms.

FIG. 21(B) illustrates {y-z} and {x-z} slices through the 3D MF map reconstructed based on 8 FID points of a single SPRITE scan.

FIG. 21(C) illustrates A schematic of the iPhone™ battery, {y-z} and {x-z} views, with current collector and the leads shown.

FIG. 22(A) illustrates longitudinal slices {x-z} and {y-z} through the 3D SPRITE MF maps of the damaged iPhone™-5 batteries whereby a 4 mm hole was punched through the middle of the lower half of the battery and the leads were removed.

FIG. 22(B) illustrates longitudinal slices {x-z} and {y-z} through the 3D SPRITE MF maps of the damaged iPhone™-5 batteries whereby a 16 mm hole was punched through the middle of the lower half of the battery and the top half of the current collector was removed, as indicated on the right.

FIG. 23(A) illustrates intact PS batteries. FIG. 23(B) illustrates damaged PS batteries. FIG. 23(C) and FIG. 23(D) illustrate longitudinal slices {x-z} through 3D MF maps reconstructed from FLASH. FIG. 23(E) and FIG. 23(F) illustrate longitudinal slices {x-z} through 3D MF maps reconstructed from SPRITE (E, F) images of the PS batteries.

Figure 1E:
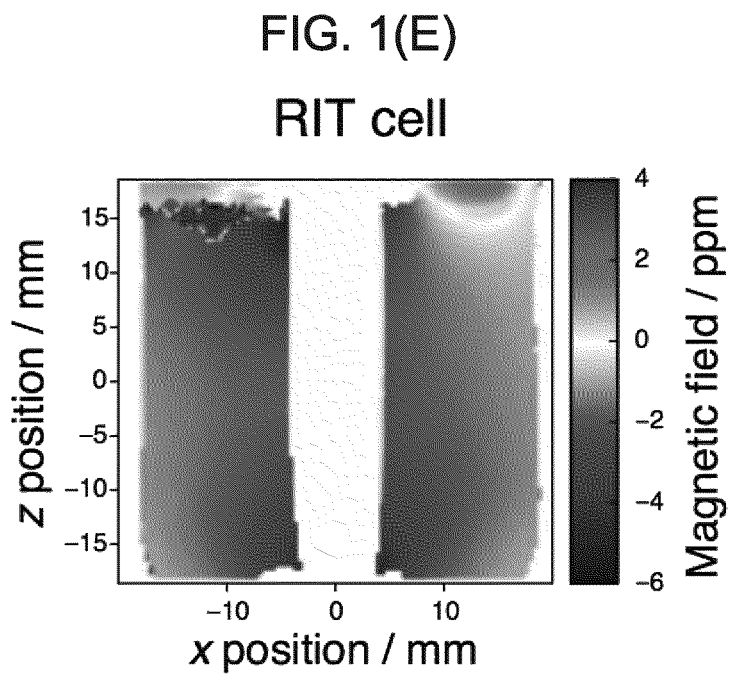
FIG. 1(E) illustrates a field map of a cell provided by the Rochester Institute of Technology (MT cell). The MT cell includes NMC ($Li_xNi_yMn_yCo_{1-2y}O_2$) as the cathode material. The field map is referenced to the empty holder, giving an absolute field map for the Li-ion cell.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF THE INVENTION

In general, the system and method described in this application relate to indirectly detecting the conductivity distribution and the distribution of magnetic susceptibility of conducting structures by measuring the space around it with NMR spectroscopy or MRI. In the embodiments described in this application, the conducting structure is a battery. However, the present application is not limited in this regard. The conducting structure may be, for example, a capacitor, a supercapacitor, a fuel cell, a catalyst material, etc. The system and method described herein provides cell diagnostics without requiring rf access to the inside of the cell. The method is based on imaging the induced or permanent magnetic field produced by the cell, and connecting it with processes occurring inside the cell. A method of diagnosing a battery includes providing the battery in a magnetic field, immersing the battery in a detection medium, or placing a detection medium in the vicinity of the battery, exciting nuclear or electronic spins within the detection medium using a broad-band excitation pulse, receiving an NMR or ESR spectrum from the detection medium, obtaining a frequency distribution of the detection medium, and indirectly measuring internal characteristics of the battery by characterizing frequency changes in the frequency distribution. Batteries are analyzed on the basis of changes in magnetic susceptibilities, a measure of the degree of magnetization of a material when a magnetic field is applied, and internal electric current distributions, which may change over the course of a charging/discharging cycle, and a result of battery degradation and failure. The reason that this magnetic field is so informative, is that the magnetic susceptibility $\chi$ is material-dependent, and that the resulting magnetic field is dependent on the distribution of the materials inside of the cell, which change during cell operation.

The magnetic susceptibility also depends on the electronic configuration of the material and hence during redox reactions, such as battery charging or discharging, there can be large changes in magnetic susceptibility. Measurements of magnetic susceptibility can therefore yield detailed information about the oxidation state of the materials inside an electrochemical device to give insights into the state of charge (SOC) of the battery and its failure mechanisms. Furthermore, the magnetic susceptibilities of many widelyused electrode materials, including, for example $Li_xMnO_2$, $Li_xFePO_4$, $Li_xCoO_2$ and $Li_xNi_yMn_yCo_{1-2y}O_2$, depend upon their lithiation state. Graphite, a popular anode material, is strongly diamagnetic and has a highly anisotropic susceptibility. In this case, as $Li^+$ intercalates into the structure, the inter-layer distance in the graphite increases and the susceptibility and its anisotropy are significantly reduced. This effect is highly dependent on the stage (the number of graphite layers between each lithium layer) of the resulting lithium intercalate.

Monitoring the magnetic field produced by the cell when it is placed into an external magnetic field thus offers the ability to monitor the electrochemical reaction in situ. Moreover, the distribution of magnetic material inside the cell influences the spatial variation in the magnetic field that it produces, such that it is also sensitive to the precise construction of the cell. In this manner, measures of the magnetic field can be used to screen for physical defects in cells.

MR methods provide the ability to measure tiny changes in magnetic field maps, for example, through the use of phase-map imaging or specific NMR probes. In the phase-map imaging approach, multiple images are acquired at different echo times and used to reconstruct the spatial variation in the induced resonance frequency shift from the evolution of the signal phases. In this manner, very accurate field maps can be obtained—of the order of μT. Since ultimately, the magnetic field changes are measured, apart from measuring the magnetic properties of a device, one could also measure current distributions in the same manner, which could arise, for example, in the relaxation phase between charging steps, or during charging or discharging itself.

Referring to FIGS. 1(A)-1(D), a system 100 for magnetic resonance mapping of physical and chemical changes in a battery 200 includes a holder 10 configured to receive the battery 200, a radiofrequency coil 20, and an NMR/MRI magnet 30. In use of the system 100, the holder 10 is disposed within the radiofrequency coil 20. The radiofrequency coil 20 is then disposed within an isocenter of the NMR/MRI magnet 30. In some examples (e.g., FIGS. 1(A)-1(D)), the holder 10, the radiofrequency coil 20, and the NMR/MRI magnet 30 are concentric. In other examples (e.g., FIG. 5C), the holder 10, the radiofrequency coil 20, and the NMR/MRI magnet 30 are not concentric. The radiofrequency coil 20 can be repeatedly removed and inserted within the NMR/MRI magnet 30. The holder 10 can be repeatedly removed and inserted within the radiofrequency coil 20. The system 100 may also include a spectrometer containing a gradient assembly and/or an imaging probe.

The holder 10 may be made of any non-magnetic material. For example, the holder 10 may be made of plastic such as poly lactic acid (PLA) plastic or acrylonitrile butadiene styrene (ABS) plastic. The holder 10 may be manufactured in any manner, for example, by 3D printing. In the example of FIG. 1(B), the holder 10 is cylindrical and partitioned into three portions: a first detection medium chamber 11, a second detection medium chamber 12, and a battery chamber 13 that separates the first detection medium chamber 11 and the second detection medium chamber 12. In other examples, the holder 10 is not cylindrical. For example, the holder 10 may have a square, obround, ovular, rectangular or otherwise oblong cross section.

The first detection medium chamber 11 and the second detection medium chamber 12 are configured to be filled with a same volume and same kind of detection medium. Each of the first detection medium chamber 11 and the second detection medium chamber 12 extends from a top of the holder 10 to a bottom of the holder 10. The detection medium may be, for example, water or water doped with a paramagnetic species (e.g., $CuSO_4$, Gd-DTPA), to shorten the T1 relaxation times for faster measurements. Other examples of a detection medium that may be used include oil or tetramethyl silane. Any detection medium may be used provided the detection medium is MR active and compatible with the material from which the holder 10 is made. The minimal requirement for the detection medium is to contain a sufficient concentration of nuclear or electronic spins leading to a strong enough magnetic resonance signal. For the detection medium, liquids are preferred because they produce narrow lines with high signal-to-noise ratios, but in some examples, it may be possible to use gas as a detection medium. The ideal detection medium would also produce only a single resonance in the frequency spectrum with little internal interactions. An example is liquid water with $^1H$ nuclear spins, which produces a very strong signal. Solids could also be used as the detection medium, but a high symmetry solid would be desired in order to minimize internal interactions, such as chemical shift anisotropy. Solids could be relevant for high-temperature applications. A low electric permittivity can increase the range of the detectable magnetic fields. Such a sample could be constructed from an oil sample, for example. It is advantageous to select a detection medium that provides a maximum MR signal (this is achieved, for example, by using a high-density liquid such as water as the detection medium).

In examples in which the detection medium is water doped with a paramagnetic species, the paramagnetic species may increase spin-lattice relaxation, and thus, the experiments could be sped up. One can typically choose a concentration regime where $T_2^* < T_2$ such that the signal amplitude is not significantly compromised due to excessive line broadening introduced by the paramagnetic species. The first detection medium chamber 11 and the second detection medium chamber 12 are configured to be sealed during use of the system 100.

The battery chamber 13 is configured to receive the battery 200 to be evaluated by the system 100. In the example of FIG. 1(B), the battery chamber 13 is a rectangular slot in a central portion of the holder 10. The battery chamber 13 extends from the top of the holder 10 to a position above the bottom of the holder 10. In other words, the battery chamber 13 does not extend to the bottom of the holder 10. The battery chamber 13 may be configured to receive a capacitor, a supercapacitor, a fuel cell, or a catalyst material.

In the example of FIG. 1(A), the battery 200 is a pouch cell battery having electrodes 210 extending from a top surface thereof. When the battery 200 is received by the battery chamber 13, the battery 200 is oriented such that the electrodes 210 are proximal to the top surface of the holder 10 and the bottom surface of the battery 200 is distal to the top surface of the holder 10. At least a portion of the battery 200 rests on a bottom surface of the battery chamber 13. A first space exists between a top of the battery 200 and the top of the holder 10. A second space exists between a bottom of the battery 200 and the bottom of the holder 10. By having the length of the battery 200 shorter than the length of the first detection medium chamber 11 and the second detection medium chamber 12 containing the detection medium, a more uniform magnetic field can be observed across the detection medium. This is not essential, however, as in other examples, the battery chamber 13 may extend an entire length of the holder 10 and the battery 200 may have a length greater than or equal to the length of the first detection medium chamber 11 and the second detection medium chamber 12 containing the detection medium. In some examples, it may be preferable to have the detection medium extend over a length of about ⅓ of the battery length at both the top and the bottom. The battery holder 10 is configured to fill the available volume of the radiofrequency coil 20 (e.g., a cylindrical space having dimensions, for example, of a 40 mm diameter and a 60 cm height 60 cm), while keeping the battery 200 centered. This setup allows for the largest area around the battery 200 to be mapped and compared to calculations for ascertaining the magnetic susceptibility of the battery 200, and therefore, in most cases, this setup will be optimal. If a smaller battery is evaluated, the size of the first detection medium chamber 11 and the second detection medium chamber 12 containing the detection medium would be the same, but the size of the battery chamber 13 would be reduced. The top surface of the battery chamber 13 is configured to remain unsealed during use of the system 100, to allow access to the electrodes 210 during evaluation of the battery 200.

The size of the holder 10 and the shape and size of the battery chamber 13 may be modified/customized to receive different shapes and sizes of batteries.

A method for magnetic resonance mapping of physical and chemical changes in a battery using the system 100 will now be described. The method includes using magnetic resonance to indirectly measure internal characteristics of a battery. Instead of detecting physical and chemical changes of the battery by directly imaging the battery, the method of the present application involves detecting changes in the detection medium that surrounds the battery and using the data to reconstruct information about the chemical and physical changes occurring inside of the battery. The detectable changes may originate from changes in magnetic susceptibilities, leading to alterations of induced magnetic moments, from changes in the permanent magnetism inside the cell, or from changes in the current distribution inside the battery.

The changes in the oxidation states of the electrochemically active ions and components of the electrode materials are intrinsic processes occurring in electrochemical devices. These changes can impact the local structure and other properties, such as their local magnetic properties. For example, the lithiation state in $Li_xCoO_2$, a common cathode material, is closely tied to the electronic structure of the Cobalt ion in the rigid $CoO_2$ layers. See Hertz, J. T.; Huang, Q.; McQueen, T.; Klimczuk, T.; Bos, J. W. G.; Viciu, L.; Cava, R. J. *Phys. Rev. B*, 77 (7), 75119 (2008), the entire contents of which is hereby incorporated by reference for all purposes including for the disclosures related to examples of how the magnetic susceptibility of electrode materials change upon lithiation. The $Co^{++}$ ions change from high spin (5 unpaired electrons) when $x≥0.97$ to low spin (1 unpaired electron) for $0.50≤x≤0.78$, and there is an accompanying increase in the magnetic susceptibility of the material by an order of magnitude. Examples of these processes include, for example, effects in carbon anodes/$LiFePO_4$ (see Kadyk, T.; Eikerling, M. *Phys Chem Chem Phys*, 17 (30), 19834-19843 (2015), the entire contents of which is hereby incorporated by reference for all purposes including for the disclosures related to examples of how the magnetic susceptibility of electrode materials change upon lithiation), and NiMnCo cathode materials (see Chernova, N. A.; Ma, M.; Xiao, J.; Whittingham, M. S.; Breger, J.; Grey, C. P. *Chem. Mater.* 19 (19), 4682-4693 (2007), the entire contents of which is hereby incorporated by reference for all purposes including for the disclosures related to examples of how the magnetic susceptibility of electrode materials change upon lithiation).

First, the first detection medium chamber 11 and the second detection medium chamber 12 of the holder 10 are filled with a desired detection medium and sealed. The battery 200 is then inserted into the battery chamber 13 of the holder 10. Next, the holder 10 is disposed within the radiofrequency coil 20. The radiofrequency coil 20 is then disposed within the isocenter of the NMR/MRI magnet 30. The battery 200 may be evaluated ex situ (i.e., charge/discharge stopped data acquisition) and/or in situ (i.e., a current is applied such that charge/discharge occur during data acquisition). A static magnetic field $B_0$ is applied. The nuclear or electronic spins within the detection medium are excited using a broad-band excitation pulse (e.g., a RF frequency for nuclear spins). A phase map is acquired and processed as described below in order to obtain a frequency distribution within the detection medium. The measurements are performed either during charging or discharging of the battery, either while current is flowing, or while current is stopped.

In one example, the internal characteristics of the battery are modeled on the basis of magnetic susceptibility differences and changes within the battery. This is accomplished by assigning one or several regions within the battery a given magnetic susceptibility and calculating the effect on the surrounding medium. The susceptibilities of the different regions form parameters that can be fit by minimizing the differences between the calculated and the measured frequency distributions in the surrounding detection medium or the detection volume.

From the observed frequency changes in the frequency distribution, it is possible to infer the overall changes in magnetic susceptibility distributions within the battery. This is important in the context of studying the health and general state of a battery and could be relevant for studying battery failure mechanisms and quality control. In particular, data from a standard Mill phase map is processed to measure the symmetry of the collected image. The symmetry of the collected image is then compared to a predetermined standard acceptable symmetry. The symmetry of the materials inside the battery is indicative of failure mechanisms, quality control during production (e.g., indicative of whether the manufactured batteries fall within an acceptable range of symmetry) and information about the efficiency of the cell during cycling. With regards to cell cycling, the comparison will indicate whether some regions of the battery are cycling more efficiently than others due to local hotspots in the electric current. This information can be obtained based solely on the frequency distribution of the detection medium (i.e., without opening the battery or measuring the battery directly).

Figure 7:
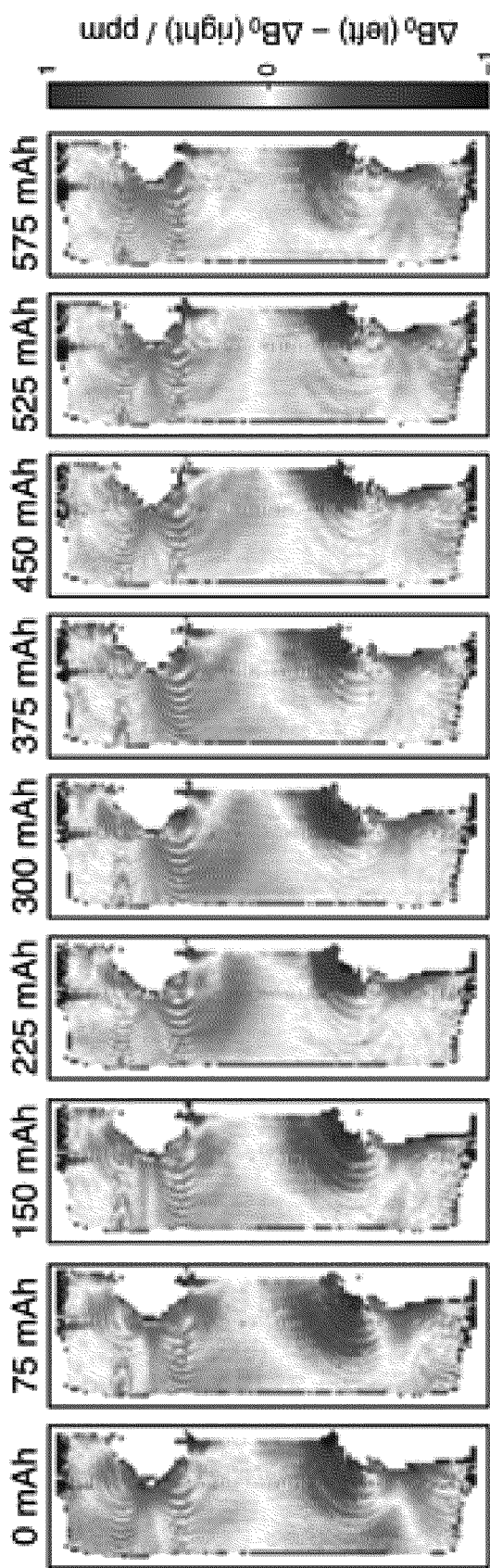
FIG. 7 illustrates a pixel-wise difference between the left and right hand sides of the magnetic field maps from FIG. 2, which were obtained ex situ during cell discharge.

A pixel comparison of the difference between the left and right hand sides of the magnetic field map may also be used to infer the overall changes in magnetic susceptibility distributions within the battery. FIG. 7 illustrates the results of taking a pixel-wise difference between the left and right hand sides of the magnetic field maps from FIG. 2, which were obtained ex situ during cell discharge. The discharge level is indicated in reference to the discharge capacity. The background field is subtracted from each map prior to taking the difference.

In another example, the internal characteristics of the battery modeled on the basis of current distributions within the battery. This is accomplished by assigning one or several regions within the battery volume given current distributions. From the currents, the generated magnetic fields are calculated and their effects on the surrounding medium are determined. The current amplitudes assigned to different regions in the battery form parameters that can be fit by minimizing the differences between the calculated and the measured frequency distributions in the surrounding detection medium or the detection volume.

In the examples in which the internal characteristics of the battery are modeled on the basis of magnetic susceptibility differences and changes within the battery, or current distributions within the battery, the state of charge (SOC) of the battery is determined by converting the determined frequency distributions into the state of charge. In conventional diagnosis methods, intact batteries are diagnosed by measuring their voltage and resistance/impedance. These values can be related to state of charge (SOC) by making calibration curves for the battery in a similar way. However, as the battery ages, the calibration changes and so mathematical models need to be included that account for aging. However, this requires some knowledge of the battery history, such as cycle life/battery health. By measuring the detection medium, as opposed to the voltage and resistance/impedance of the battery itself, it is possible to provide an independent measure of the SOC. If desired, the independent measure of the SOC may be combined with the voltage/resistance measurements to double-check the SOC and battery health.

Several experiments were performed, as described below.

Experimental Setup

In the experiments, the holder was 3D printed using PLA plastic. The detection medium selected was water. The battery was a non-magnetic PGEB-NM053040 lithium polymer pouch cell having a rated capacity of 600 mAh and a measurement of 5 mm×30 mm×40 mm. Prior to the experiments, the battery (i.e., the pouch cell) was fully charged by applying 120 mA (0.2 C) current until the cutoff voltage of 4.2 V was reached.

MRI Experiments

The MRI experiments were performed on a Bruker Ultrashield 9.4 T Avance I spectrometer containing a Bruker Mini0.75 gradient assembly and operating at 400.1 MHz for 1H. A Bruker MiniWB57 imaging probe was used to collect the data, with a Bruker WB57 40 mm inside diameter (i.d.) coil insert for $^1$H experiments. 2D and 3D gradient echo experiments were performed using the FLASH sequence implemented in Paravision 5.1.

For the 2D experiments, a 1 mm slice was acquired with a 51.2×51.2 mm square field of view (FOV) with 128 points in both the read and phase dimensions, to give a nominal resolution of 0.4×0.4 mm. The slice was taken perpendicular to the major face of the battery (hereinafter the "sagittal plane"), which is illustrated in FIG. 1(D). Spatial encoding using the readout gradient was performed in the vertical (z) direction which gave fewer artifacts from the detection medium outside the FOV. For the ex situ experiments, a nominal flip angle (a) of 15° was used with a repetition time (TR) of 100 ms. The ex situ experiment took 2 min 33 s, with 12 averaging scans (NS) acquired. For in situ experiments, a nominal flip angle (a) of 10° was used with a repetition time (TR) of 40 ms. The in situ experiment took 20 s, with 4 averaging scans (NS) acquired. Reasonable experiment times were chosen and then the flip angles can be taken as slightly less than the Ernst angle ($\alpha \leq \alpha_E = \cos^{-1}(e^{-TR/T_1})$ with $T_1 = 2.5$ s for water). For the in situ and 3D experiments it was important to minimize the experiment time, and TR and a were reduced accordingly. Additional parameter tests were performed to maximize the signal to noise ratio (SNR) for a given experiment time.

The 3D experiments used an isotropic 51.2 mm FOV with 128 points in each dimension to give a nominal, isotropic resolution of 0.4 mm. For the 3D experiments, a nominal flip angle ($\alpha$) of 5° was used with a repetition time (TR) of 15 ms. The 3D experiment took 4 min 5 s, with 1 averaging scan (NS) acquired. The 3D experiments measure the same properties (a phase map) as the 2D experiments, but in all three spatial dimensions. Only two spatial dimensions are mapped in the 2D experiments, with slice selection used during the rf excitation to localize the maps to a single slice in the third dimension. 3D measurements could provide additional accuracy.

The experiments were repeated at multiple echo times (TEs) from a minimum of 2.45 ms, and the image series used to reconstruct the local field map surrounding the battery, as detailed below.

Image Processing

The purpose of the gradient echo MRI experiments is to obtain the true phase maps, $\theta(r)$, of the detection medium. However, the detection of NMR or MRI is limited to the range $(-\pi, \pi]$, and so any regions of the measured phase maps, $\theta_{wr}(r)$, that lie outside of this range will be wrapped, $\theta_{wr}(r) = \theta(r) - 2\pi n(r)$. To recover the true phase maps, the integer wrapping parameters, $n(r)$, must be obtained. In general, the accumulated phase is proportional to the TE used in the experiment, $\theta(r, TE) = \theta_{rec}(r) + \omega(r) \cdot TE$, where $\omega(r)$ is the angular frequency offset relative to the carrier frequency of the rf pulse used and $\theta_{rec}(r)$ is an additional, static phase offset caused by the receiver. The time-dependent effects of nutation can be isolated by comparing the phase difference between two consecutive echoes, $\delta TE_{i+1,i} = TE_{i+1} - TE_i$, so that $\delta\theta_{i+1,i}(r) = \omega(r) \cdot \delta TE_{i+1,i}$ (where the i subscript indicates the echo number). The consecutive echoes can be obtained from a multi-echo acquisition after a single excitation, or from separate experiments. The former approach allows for a more rapid overall acquisition but results in longer $\delta TE_{i+1,i}$ times due to the need for additional gradients to be applied. The latter approach, used here, has the advantage of allowing arbitrarily small values for $\delta TE_{i+1,i}$, limited only by the effective clock speed of the spectrometer, which is typically of the order of 1 μs or less. Minimizing $\delta TE_{21}$ reduces the occurrence of phase wrapping between the consecutive scans.

Following roughly the methodology of the UMPIRE algorithm (Robinson, S.; Schödl, H.; Trattnig, *S. Magn. Reson. Med. Off. J. Soc. Magn. Reson. Med. Soc. Magn. Reson. Med.*, 72 (1), 80-92 (2014), the entire contents of which is hereby incorporated by reference), experiments were obtained at four different TEs, $TE_1 = 2.45$ ms, $TE_2 = 2.50$ ms, $TE_3 = 2.75$ ms and $TE_4 = 2.80$ ms. By converting each image, $S_i$ to a phase map, $$\theta_{wr}^i(r) = \tan^{-1}[Im(S_i(r))/Re(S_i(r))], \qquad (1)$$

the difference maps $\delta\theta_{21}(r)$, $\delta\theta_{32}(r)$ and $\delta\theta_{43}(r)$ can be obtained and used to calculate three estimates of $\omega(r)$. The median value of $\omega(r)$ is then used to find the integer coefficients $n_{i+1,i}(r)$ that unwrap each of the phase difference images, $$n_{i+1,i}(r) = \left\lfloor \frac{\delta\theta_{i+1,i}(r) - \delta TE_{i+1,i} \cdot \omega(r)}{2\pi} \right\rfloor, \qquad (2)$$

where the brackets denote the floor function. Each phase difference map is unwrapped accordingly, $$\delta\theta'_{i+1,i} = \delta\theta_{i+1,i}(r) - 2\pi n_{i+1,i}(r). \quad (3)$$

From the set of unwrapped phase difference maps we can obtain a second, more accurate estimate of $\omega(r)$, again by taking the median of the values from the three phase difference images. Eqs 2 and 3 can then be used to unwrap the original phase maps and obtain the true phase maps, $\theta(r)$, at each of the echo times.

One aspect of interest is the field map, which is expressed in units of ppm relative to the Larmor frequency, $v_0$, of the $^1$H nuclear spin (400.13 MHz at the 9.4T field used in the experiments), $\Delta B_0(r) = (\omega(r)/2\pi) \cdot (10^6/v_0)$. While this quantity could be calculated directly from the most accurate estimate of $(\omega(r)$ obtained from the difference maps, pixel-wise least square fits of $\theta(r)$ as a function of TE can provide more accurate values incorporating all of the data. Moreover, the total least squares error on each fit can be used to discriminate between pixels where the unwrapping procedure has or has not worked. In the pixels where the unwrapping procedure failed, typically 10-20 pixels per image, a nearest-neighbor smoothing algorithm was used to assign $\Delta B_0(r)$.

The results from the gradient echo experiments were converted into an unwrapped phase map, and finally to a magnetic field map via the UMPIRE algorithm. The magnetic susceptibility of the battery is calculated from the field map by comparing the experimentally obtained $\Delta B_0(r)$ map with calculation. In particular, the field map surrounding a model battery geometry matching the powerstream cell was calculated using the FFT method, with the same FOV (zero filled) as the experimental image. The FFT method is described, for example, in Salomir, R.; de Senneville, B. D.; Moonen, C. T. *Concepts Magn. Reson.*, 19B (1), 26-34 (2003), and Ilott, A. J.; Chandrashekar, S.; Klöckner, A.; Chang, H. J.; Trease, N. M.; Grey, C. P.; Greengard, L.; Jerschow, A. *J. Magn. Reson.* 245, 143-149 (2014), the entire contents of which are hereby incorporated by reference. The susceptibility value for the battery was fitted using a Python program to minimize the difference between the simulated and experimental phase maps. A single (volume) susceptibility is used to describe the whole battery in these examples, although further battery-specific models could be used, wherein different susceptibilities are assigned to different regions within the battery.

Results

Figure 1F:
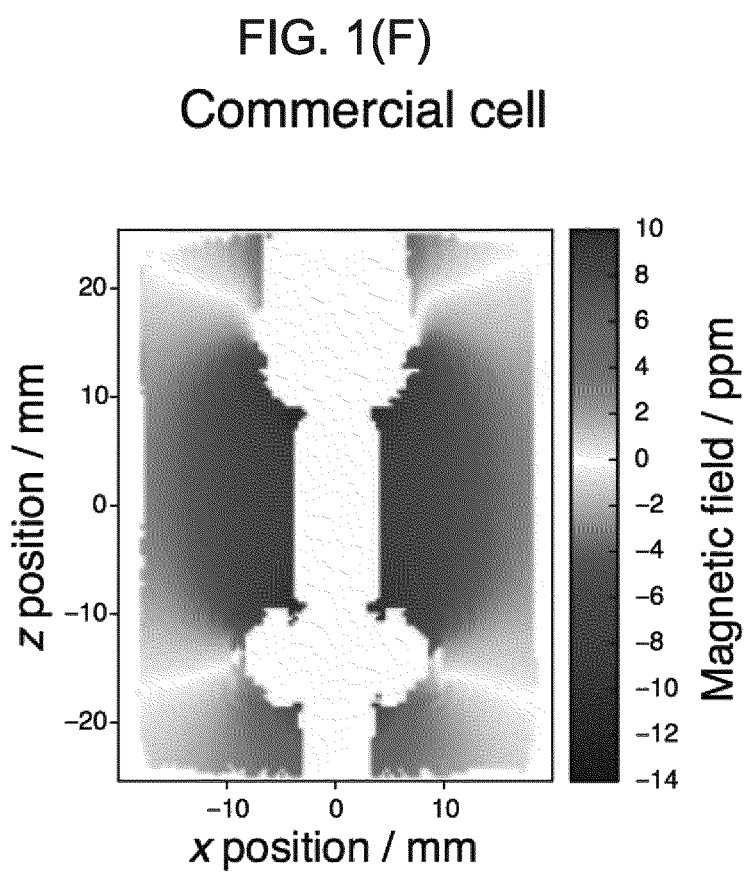
FIG. 1(F) illustrates a field map of a commercial cell, which includes LCO ($Li_xCoO_2$) as the cathode material. The field map is referenced to the empty holder, giving an absolute field map for the Li-ion cell.

FIGS. 1(E) and 1(F) illustrate field maps measured for the cells. In particular, FIG. 1(E) illustrates a field map of a cell provided by the Rochester Institute of Technology (RIT cell) that includes NMC ($Li_xNi_yMn_yCo_{1-2y}O_2$) as the cathode material. FIG. 1(F) illustrates a field map of a commercial cell that includes LCO ($Li_xCoO_2$) as the cathode material. As evidenced by FIGS. 1(E) and 1(F), the system and method described herein can work with different types of cells. For the RIT cell experiment, the exact information about all the battery components and materials were known. However, such information was not available for the commercial cell. Thus, the RIT cell experiment provides validation of the technique and demonstrating that it is possible to calculate absolute cathode magnetic susceptibility values, as the "known" information was available to corroborate the results. The use of the RIT cell also enabled the focus and proof of concept for application of systems described herein for diagnosis of specific defects of cells.

The field maps are referenced to the empty holder, giving an absolute field map for the Li-ion cell. Only the magnetic field in the plane perpendicular to the main face of the cell is displayed for clarity. The map shows a 1-2 ppm change in the field due to the magnetic properties of the battery. This change in field is large in comparison to the typical resolution limit of phase mapping methods, where it has been demonstrated that differences in susceptibilities of 0.1 ppm (or about 1 µT) can be resolved easily. The method is insensitive to changes in the background field or fluctuations in the instrument's magnetic field because all measurements can be taken with respect to a reference image of either the holder alone, a reference cell or the initial state of the same cell. There are artifacts at the corners of the field map, as expected, where the magnetic properties change particularly rapidly, which is also due to the presence of the leads and air pockets, but these effects are short-ranged and these regions can be neglected.

Figure 2:
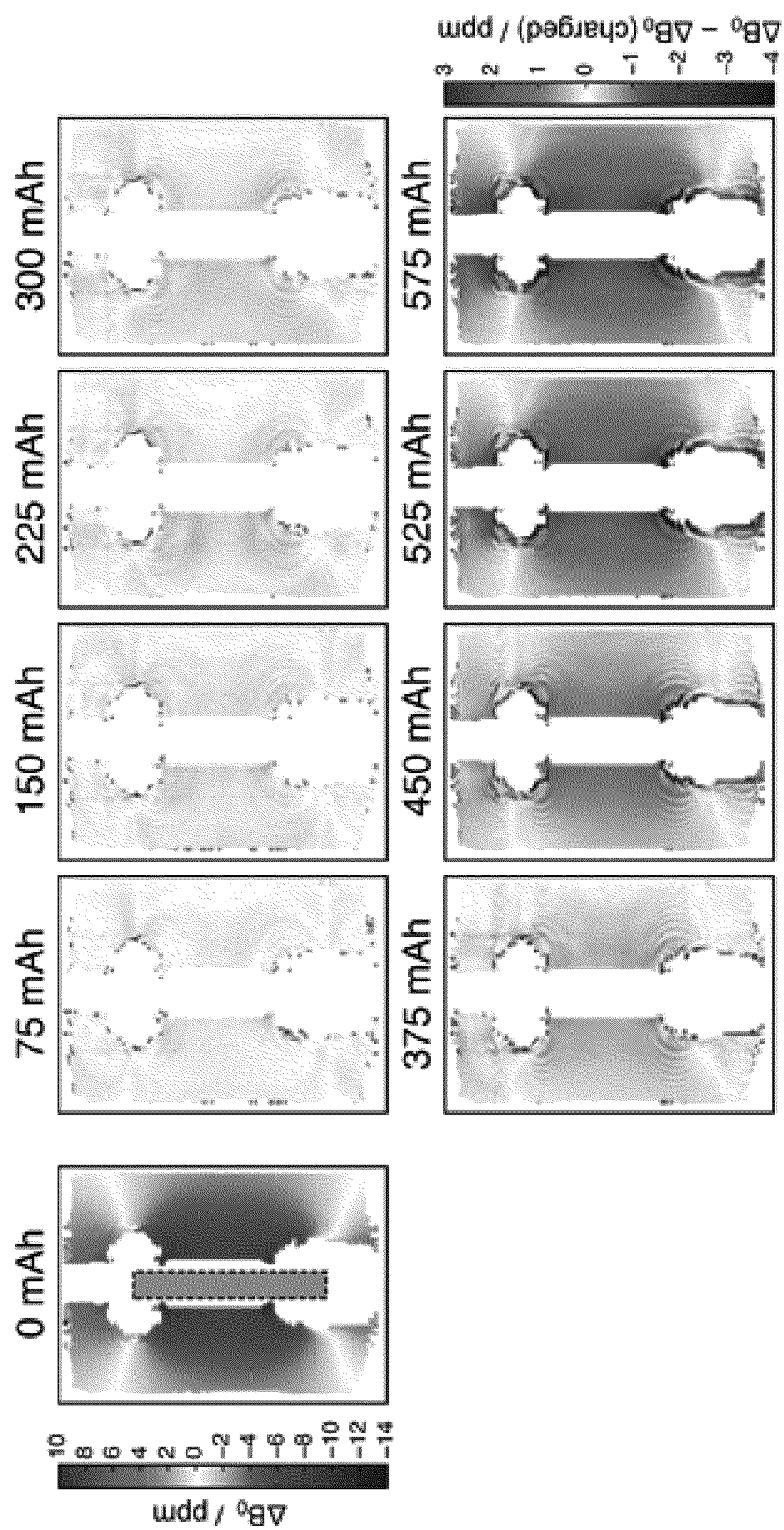
FIG. 2 illustrates reconstructed magnetic field maps surrounding the battery as it is discharged in situ. The discharge level is indicated in reference to the discharge capacity. The map for the fully charged battery (top left) is shown after subtraction of the background field map (top left colorbar), while the rest of the maps are given relative to the field map of the 0 mAh, fully charged battery (bottom right colorbar). The approximate position of the battery is illustrated in the top left image.

While FIGS. 1(E) and 1(F) illustrate an individual measurement, FIG. 2 illustrates field maps of the commercial cell at different stages of discharge. In particular, FIG. 2 shows the reconstructed field maps for one of the batteries (commercial cell), with snapshots taken at different points during discharge. When the battery is fully charged, the local field map varies from −14 to +10 ppm. Most regions of the map are successfully reconstructed, although close to the corners of the battery there is complete cancellation of the signal. This effect is due to the rapidly changing field, and occurs where the phase changes by close to $2\pi$ or more across a single voxel. These regions impact a limited area of the map and did not compromise further analysis.

The remaining images in FIG. 2 chart the relative changes in the field map as the battery is discharged. During the initial stages of discharge (75-300 mAh) the changes are relatively minor, with the magnitude of the field reducing (indicating that the average magnetic susceptibility inside the battery is also reducing) within approximately 0.5 ppm of the fully charged case. The changes are accelerated at higher stages of discharge (375-575 mAh) until there is up to 3-4 ppm change in magnitude at the fully discharged state.

The field maps are used to estimate the average magnetic susceptibility of the materials inside of the battery (FIG. 3), as detailed in the methods section. Following the trends visible in the field maps, the fits show the susceptibility of the battery to change only slightly until 350 mAh, when there is a strong decrease to approximately 70% of the maximum value. The trends are the same on charge as on discharge, suggesting that the oxidation state of the electrode materials is the same at equivalent points on charge versus discharge. If the materials and their relative volume fractions inside the battery were known, it would be straightforward to calculate the magnetic susceptibility at each stage of lithiation for the anode and cathode, and to convert the susceptibility axis in the plot in FIG. 3 to a lithiation fraction for each material.

Figure 3:
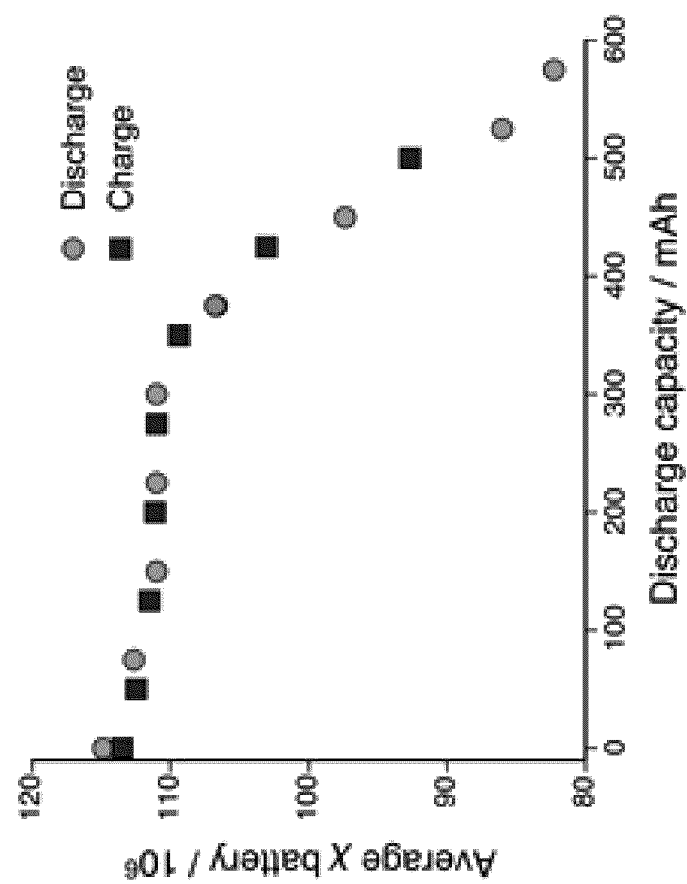
FIG. 3 illustrates values for the magnetic susceptibility of the whole battery obtained by fitting the sagittal imaging slices from FIG. 2.

The curve in FIG. 3 can also be used to calibrate the measured susceptibility as an indicator of the current state of charge (SOC) of the battery. This method would be particularly effective at discharge capacities above 300 mAh where the susceptibility changes are greater, but it could be combined with voltage and other measurements to classify batteries in the initial stages of discharge. The calibration curve would be slightly different for each type of battery and constituent chemistry.

Figure 8:
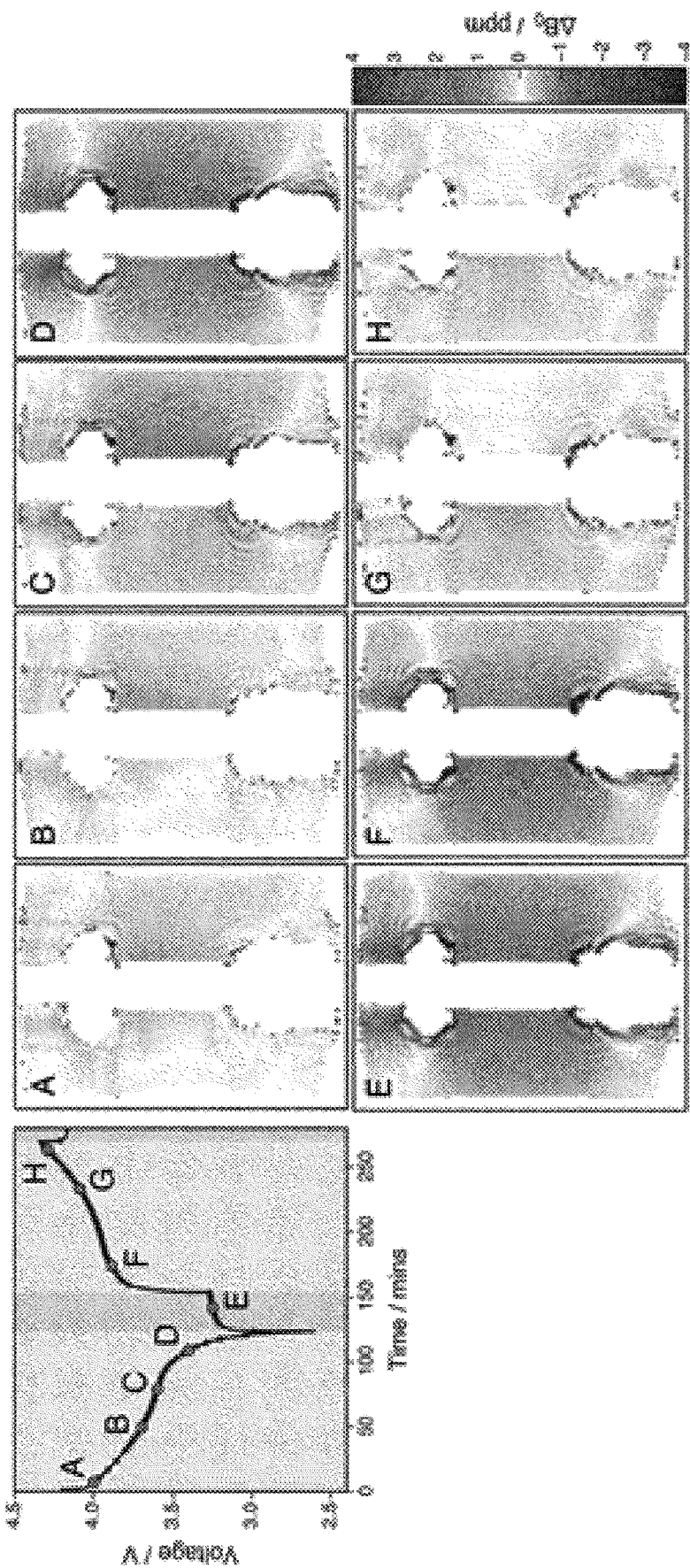
FIG. 8 illustrates sagittal snapshots of the field maps during the in situ discharge/charge cycle.

The experiments were repeated in situ on a second (fresh) cell, with a charge/discharge rate of 0.5 C and 30-minute rest periods after charge/discharge. The results of the consecutive imaging scans are shown in FIG. 8, which displays sagittal snapshots of the field maps during the in situ discharge/charge cycle. The labeled red circles on the electrochemistry plot indicate the times at which the eight images were acquired, while the smaller black squares on the voltage curve illustrate the positions of all of the images (not shown) taken during the acquisition series, demonstrating the high temporal resolution of the method. The $\Delta B_0$ map of the fully charged battery is subtracted from the displayed field maps. The maps show an asymmetry between the left and right sides of the cell; during discharge, the right side of the map has a higher field shift than the fully charged reference image (red regions) while the left side of the map has a lower field (blue regions). During the charge period, this trend is reversed. Thus, it appears that the left and right sides of the detection medium 'see' batteries with differing magnetic susceptibilities.

Figure 4:
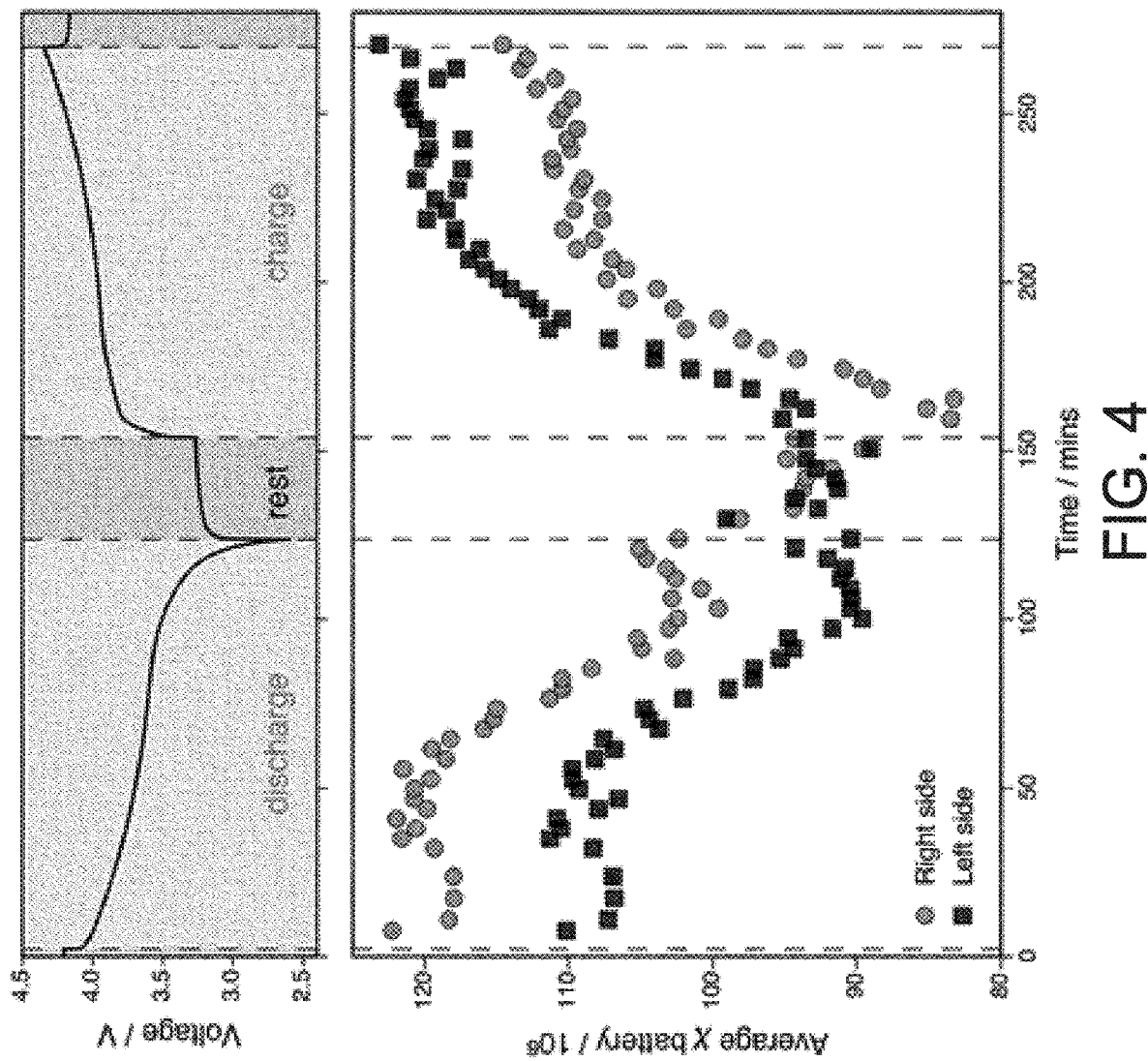
FIG. 4 illustrates fitted susceptibilities of the left and right sides of the battery during the in situ charge/discharge cycle at a rate of 0.5 C inside the NMR magnet. The voltage curve is displayed for the same time period (top).

To account for the spatial variation, fits of the experimental susceptibility distribution were performed separately for the left and right sides of the image, obtaining separate estimates of the battery susceptibility for each. This method was preferred to one in which each side of the battery was assigned independent susceptibilities, with the latter resulting in more time consuming and unstable fits. The results (FIG. 4) show there to be a significant, ca. $1 \times 10^{-5}$ difference in battery susceptibilities obtained from the right and left sides of the battery, with the right side sensing a higher susceptibility on discharge and the left side a higher susceptibility on the subsequent charge, with a significant swing in the susceptibilities during the resting step between the two periods and subsequent reversal of the applied current direction.

This type of spatial variation is not observed in the ex situ results. This difference may be due to the extra time during which the battery can relax before the experiments are performed ex situ. A second possibility is that the application of the current itself results in an additional modification to the magnetic field, which could be calculated according to the Biot-Savart Law if the current distribution were known. When the current changes direction the magnetic field should also reverse, as is observed in FIG. 4. Furthermore, this explanation for the phenomenon would lead to almost instantaneous changes in the measured field when the applied current is switched on or off, as appears to be the case. Applicant believes that the field change should be proportional to the current. If the field change is due to the applied current, the effects can be isolated by measuring the field change as a function of the applied current and separating this contribution from the magnetic susceptibility effects. The result will be a magnetic field map that can be related to the current distribution inside the battery, also a unique and powerful method.

Figure 9:
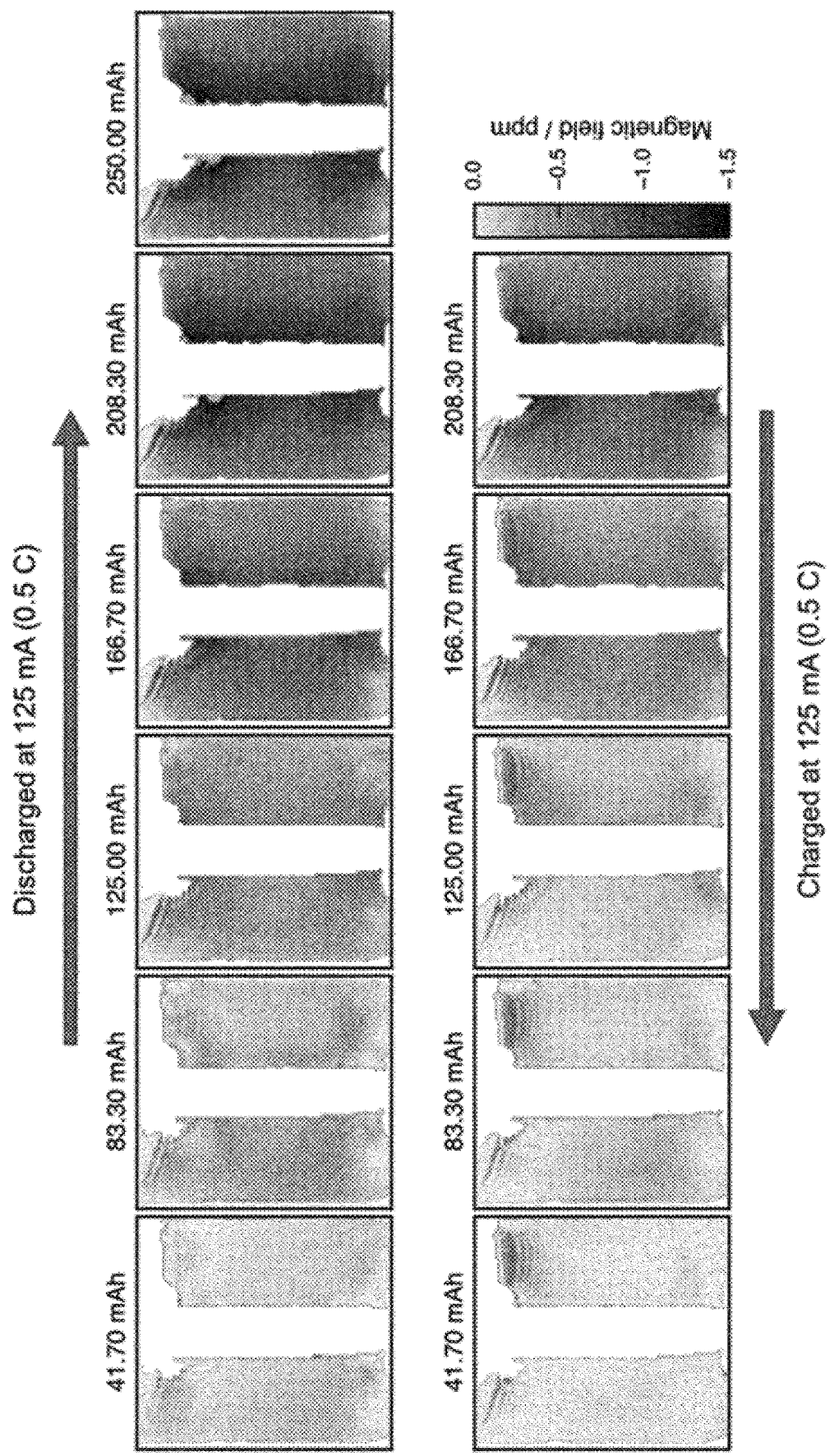
FIG. 9 illustrates a series of magnetic field maps taken at intervals during discharge and then charge of the cell. The plots are labeled by the discharge capacity of the cell at each step. The magnetic field is displayed with the fully charged cell as reference. The RIT cell was used for this purpose, and the susceptibility increased upon discharge.

The magnetic field can be used as a diagnostic for a cell's state of charge and to measure inconsistencies and defects in a cell's construction. FIG. 9 shows the change in the field map measured around the cell at discrete steps during discharge and then charge. The maps show that the field gradually reduces during discharge, to a minimum of −1.5 ppm (14.1 µT) lower than in the fully charged cell, with the reverse trend followed on the subsequent charge steps. The changes occur in a mostly symmetric fashion, with two symmetry planes bisecting the map vertically and horizontally.

Each step in the charge/discharge profile in FIG. 9 results in a unique field map, with changes that can be readily measured. This one-to-one mapping between charge state and the measured field map can therefore provide a fast tool for recovering the state of charge of an unknown cell, which may not be available from voltage measurements for many cell types, especially if the cell is compromised. More importantly, because it is the variation in the oxidation states of the anode and cathode materials that drive the differences in the measured bulk magnetic susceptibility, the field maps can provide vital additional information about cell health.

Figure 10B:
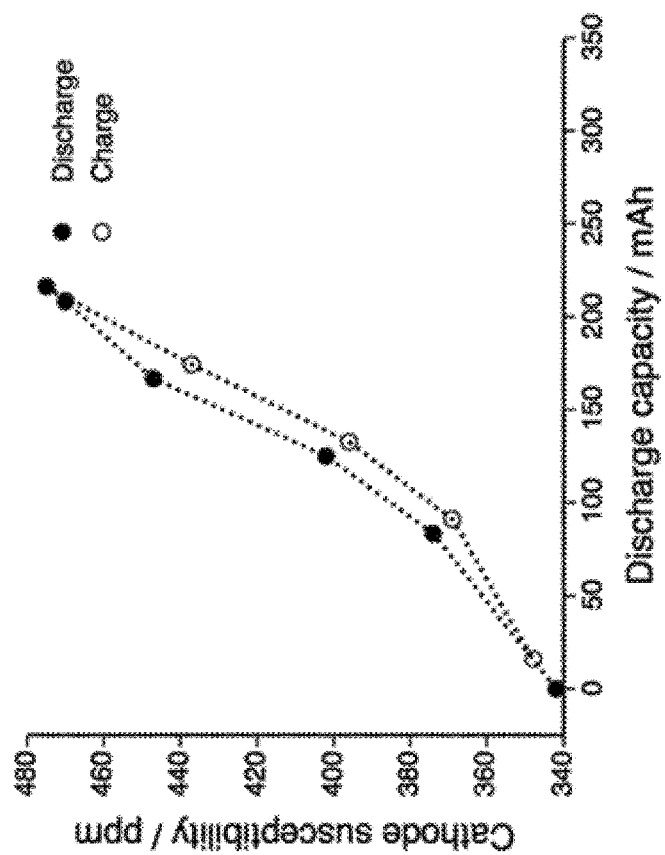
FIGS. 10(A)-10(B) illustrate fitted magnetic susceptibilities of the cell during the discharge/charge. For simplicity, the cell is assumed to have an average volume susceptibility in FIG. 10(A). Error bars are smaller than the size of the points. Knowing the cell construction, one can, however, also determine the average susceptibility of the cathode material in FIG. 10(B). The susceptibility values are given in ppm indicating a factor of $10^{-6}$.
Figure 10A:
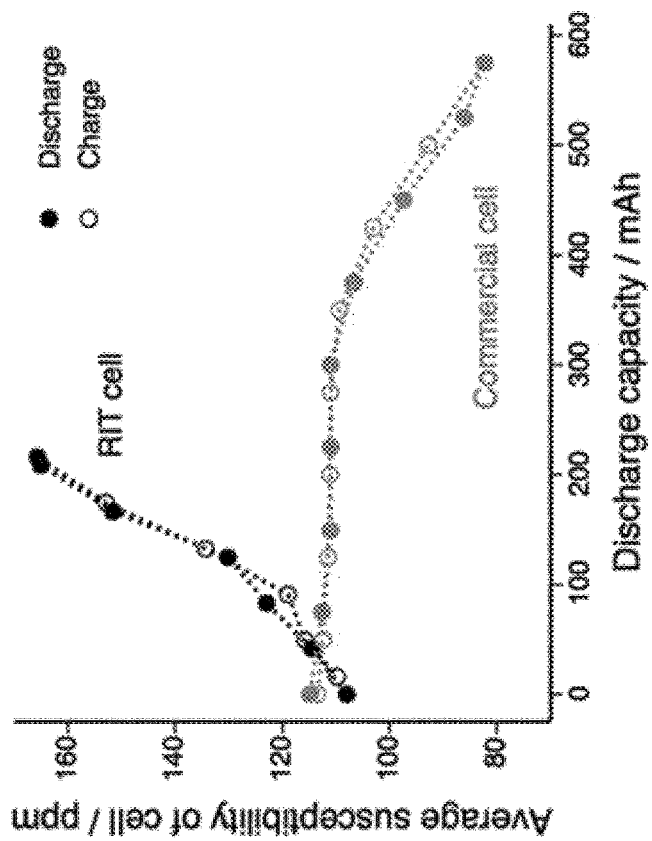

From this data, the cell's susceptibility changes over the charge cycle can be derived. FIG. 10 shows how the bulk magnetic susceptibility changes during discharge for two types of cells. The RIT cell uses NMC ($Li_xNi_yMn_yCo_{1-2y}O_2$) as the cathode material, and it is known that the magnetic susceptibility of this material increases with lithiation level. By contrast, results are also shown for a commercial cell with LCO ($LixCoO_2$) as the cathode material. In that case, susceptibility decreases upon cathode lithiation (discharge). Both of these effects are clearly observed over a full cycle in FIG. 10(A), and can be measured precisely. The analysis shown in FIG. 10(A) is based on the simplest-possible model, the susceptibility being distributed uniformly across the cell. Knowing the geometry and the materials of the cell, however, one can obtain a more detailed analysis and extract the susceptibility changes of the cathode materials alone, which are shown in FIG. 10(B).

The susceptibility-induced modification to $B_0$ caused by the paramagnetic lithium metal structure inside the voxel was calculated using a FFT method according to the equation $$h_{obj,z} = -H_0 \cdot FT^{-1}\left[\frac{k_z^2}{k^2} \cdot FT(X)\right]. \tag{S1}$$

Susceptibility values for the cells were obtained in two different ways: (1) Average susceptibility for the whole cell: the susceptibility value was obtained by performing a numerical fit to match the experimental magnetic field map with the predicted one from the cuboid. (2) In order to obtain the cathode susceptibility, the known susceptibility values for all other components were obtained from the literature, and the volume fraction of the active cathode material was used to calculate the contribution from the cathode alone. The cell was weighed and measured to obtain the total mass and volume. Using the mean experimental susceptibility of the whole cell, the volume fraction of each component, and susceptibility values of all components except the cathode, one can calculate the susceptibility of the cathode changing by oxidation state. See Tables 1 and 2 below for the results.

Average susceptibility for the whole cell may be calculated using the following method to fit the experimental field map to recover the cell susceptibility:

1. A 3D model system, $\chi(x, y, z)$ is built to represent the susceptibility of the cell, with a cuboid representing the cell in the center of the simulation box. The simulation box is $256^3$ voxels and nominally represents a volume of $102 \times 102 \times 102$ mm with a 400 µm isotropic resolution to match the experimental conditions. A cuboid with dimensions $4.8 \times 29.6 \times 30.4$ mm is used for the commercial cell and $2.4 \times 35.2 \times 51$ mm for the RIT cell. The susceptibility values in the cell are set such that $\chi(\text{inside battery}) = \chi_{cell}$ and $\chi = 0$ elsewhere.
2. The FFT susceptibility calculation method is used to predict the 3D magnetic field map around the cell in the model system, $B_{0,sim}(x, y, z)$ (2D slide shown in FIG. 13).
3. A 2D slice of the simulated map is cropped (dotted box in FIG. 13) to match the dimensions of the experimental image. An additional mask is applied to select only regions that are non-zero in the experimental image, $B_{0,exp}(x, y)$, which has been corrected by the reference image of the cell holder alone, i.e.

$$B'_{0,sim}(x, y) = \begin{cases} B_{0,sim}(x, y), & B_{0,exp}(x, y) \neq 0 \\ 0, & B_{0,exp}(x, y) = 0 \end{cases}$$

4. The least squares error between the simulated and experimental field maps is calculated, $|B_{0,sim}(x, y) - B_{0,exp}(x, y)|$, and summed, to provide a measure of the similarity between the two maps (FIG. 13(D)).

Figure 13:
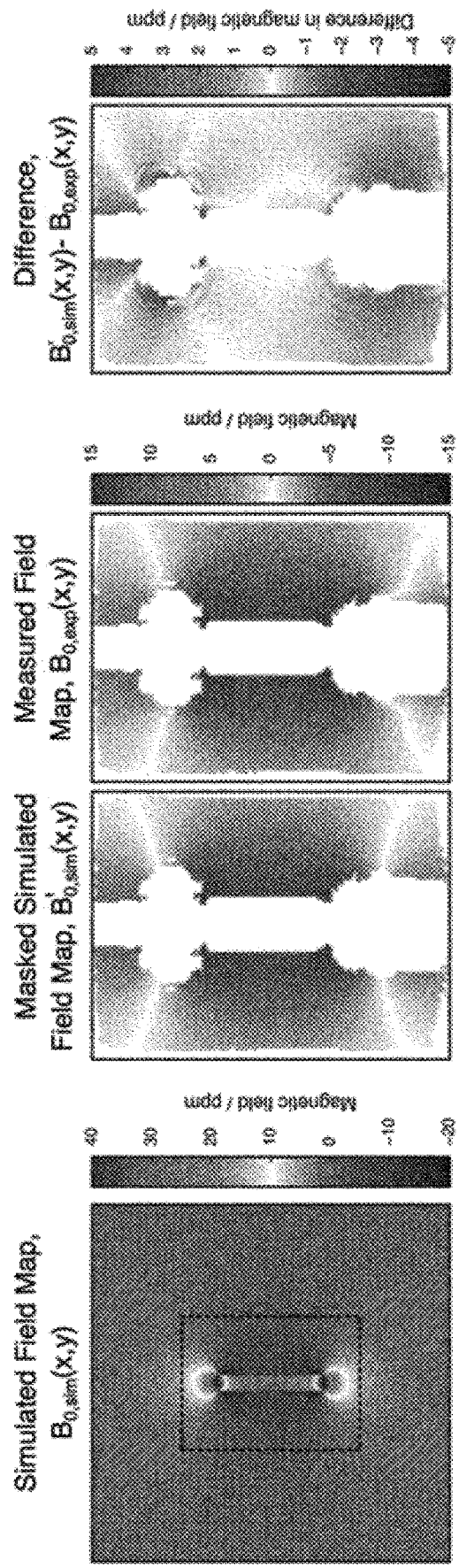
FIG. 13 illustrates the susceptibility fitting process for the fully charged commercial cell.

The minimize function in the scipy package is used to fit the value of $\chi_{cell}$ by repeating the calculation. The right-hand side of FIG. 13 shows the difference between the experimental and simulation field maps for the optimally fitted value for $\chi_{cell}$. The deviation is relatively large and illustrates the availability of further information beyond the basic model.

Using the physical measurements of the cell components and the anode susceptibility and the mean susceptibility of the cell at each state of charge, the cathode susceptibility was calculated as seen in Table 1 below. The volume fraction of each component is used to determine its contribution to the overall observed susceptibility.

TABLE 1

| Discharge capacity (mAh) | Anode susceptibility $\chi_{volume}$ | Mean susceptibility of the cell $\chi_{volume}$ | Cathode susceptibility $\chi_{volume}$ |
|---|---|---|---|
| 0 | $-2.72 \cdot 10^{-5}$ | $1.08 \cdot 10^{-4}$ | $3.42 \cdot 10^{-4}$ |
| 95 | $-2.28 \cdot 10^{-5}$ | $1.22 \cdot 10^{-4}$ | $3.78 \cdot 10^{-4}$ |
| 125 | $-2.08 \cdot 10^{-5}$ | $1.31 \cdot 10^{-4}$ | $4.02 \cdot 10^{-4}$ |
| 185 | $-6.77 \cdot 10^{-5}$ | $1.52 \cdot 10^{-4}$ | $4.47 \cdot 10^{-4}$ |
| 215 | $5.56 \cdot 10^{-5}$ | $1.65 \cdot 10^{-4}$ | $4.70 \cdot 10^{-4}$ |
| 250 | $3.68 \cdot 10^{-5}$ | $1.66 \cdot 10^{-4}$ | $4.75 \cdot 10^{-4}$ |

Figure 11:
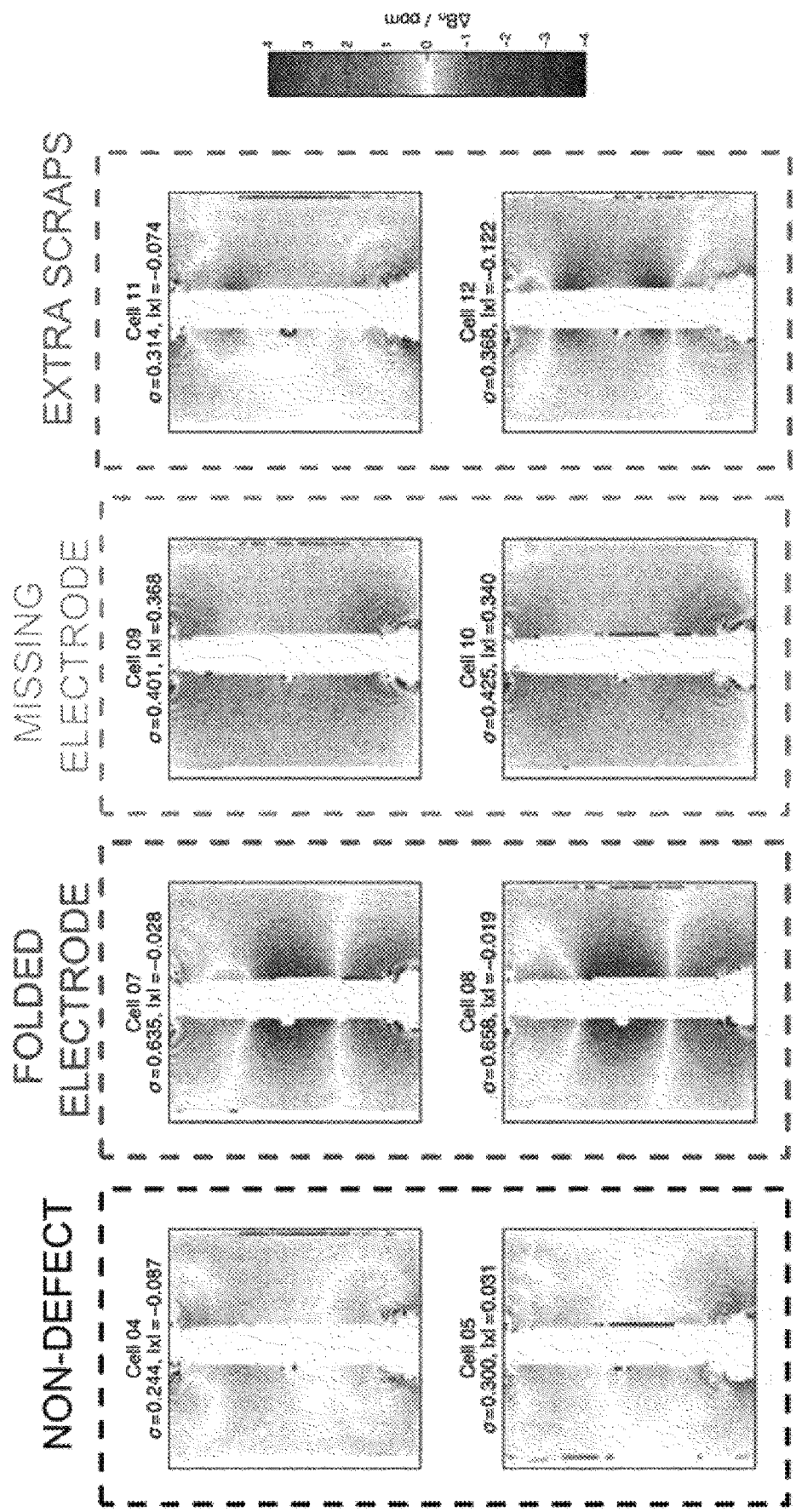
FIG. 11 illustrates magnetic field maps for the defect cells, with the mean and standard deviation indicated (taken over all of the voxels in each image). The fields are given relative to one of the non-defect cells (not shown).

Both the spatial dependence of the oxidation state, and the distribution of the material in space also affect the bulk magnetic susceptibility. Therefore, this tool can be used to detect changes in the cell over time, as well as physical defects in a cell. FIG. 11 shows the resulting field maps when the method is applied to a series of pouch cells that are purposely defected by either folding one of the cathodes, removing a cathode altogether, or adding small scraps of electrode material into the cell construction. Not only do the measured field maps show strong differences that are indicative of the defect types, the observed changes are also intuitive and diagnostic. For example, when the electrode is folded, new features are observed in the image at the locations where the fold occurs. When there is a missing cathode, the mean value of the field noticeably increases, as would be expected. The changes are subtler when extra scraps are added to the cell, but there is a slight increase in the mean and standard deviation of the measured magnetic field. Furthermore, the MRI method is sensitive enough to resolve significant differences for even the two cells which were prepared without defects. These small differences may not result in critical cell failures but could still affect overall cell capacity and performance. This additional information could be leveraged by correlating data from a large number of cell magnetic field maps with their synthesis/manufacturing conditions and electrochemical performance. It should be noted that the susceptibility measurements shown here can also be performed with cells that are not fully finished (i.e. do not contain electrolyte), and thus a manufacturer could potentially avoid a costly finishing and formation cycle of cells that are shown to be defective at this stage. The defective cells studied here were in that form (without electrolyte) to illustrate this point.

Figure 12:
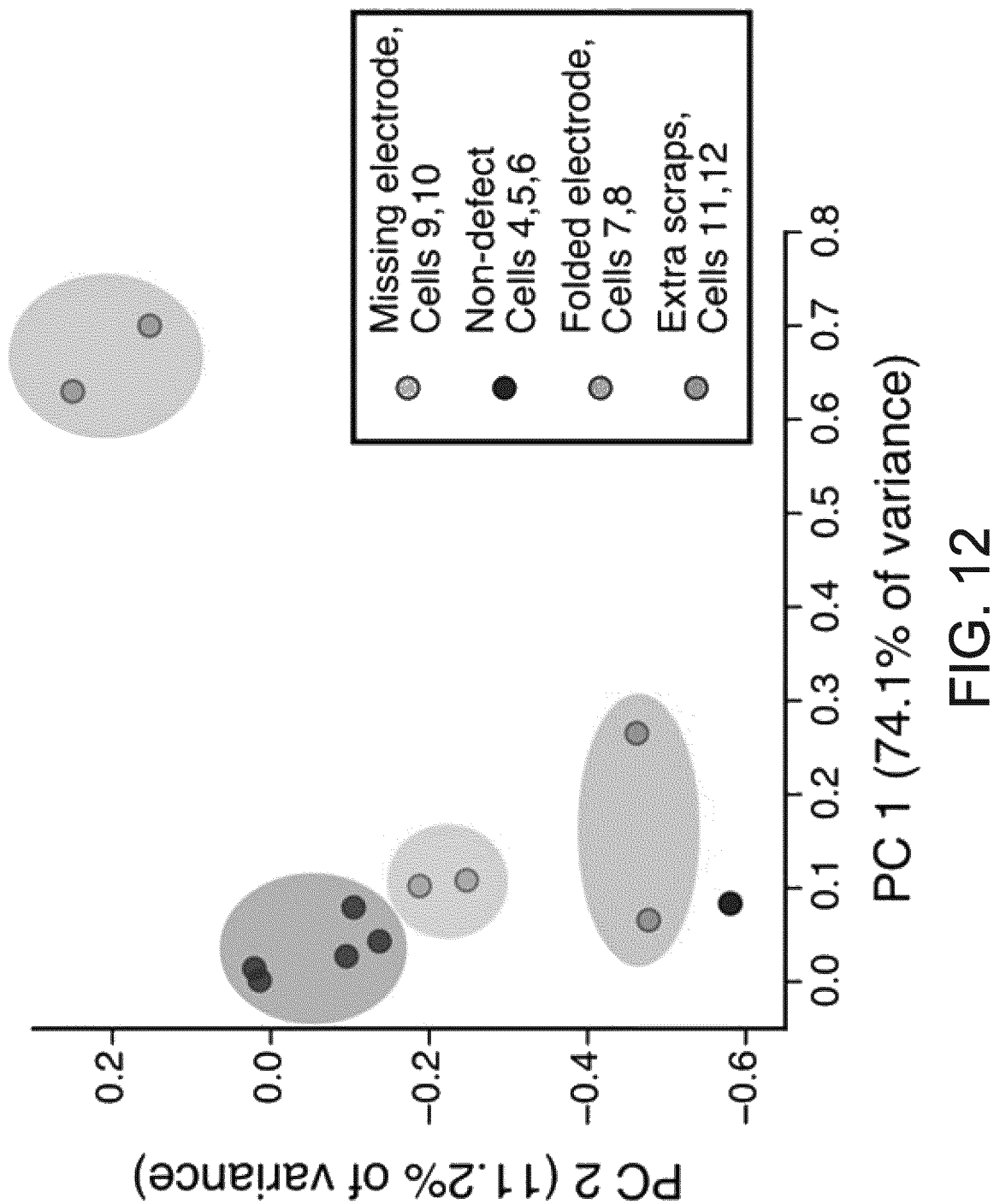
FIG. 12 illustrates the principal component analysis performed on the magnetic field maps of the cells shown in FIG. 11.

Although many defects are clearly visible and interpretable from the field maps directly (FIG. 11), further opportunities arise when one considers a potentially high-throughput application. The measurements are sufficiently fast to be performed on a large number of cells, and the results could be correlated with additional cell characteristics to predict cell differences based on subtle features in the maps. To illustrate this point, a principal component analysis (PCA) was performed using the 2D images from FIG. 11 on the limited number of samples available. The PCA score plot is shown in FIG. 12, where a strong grouping can be seen for each of the cell types. Interestingly, while it could be difficult to visually differentiate between the non-defected cells and those with extra scraps, the PCA shows a clear grouping and separation using the second principal component.

In this example, the PCA was performed on the 2D magnetic field maps which are themselves reconstructed from multiple phase map images. In this kind of analysis there is no requirement for the input data to be a coherent image. Instead, optimized experiments could be designed that sample the regions of k-space that are expected to vary most strongly. In this manner, the diagnostic power of the experiments could be preserved (or even improved) while drastically reducing the overall experiment time. This latter approach could further benefit from a big data approach, in which machine learning algorithms could be used to more efficiently classify cells by defect type. In this way, one could further enhance the information content of the observed magnetic field maps.

Diagnosing Current Distributions in Batteries with Magnetic Resonance Imaging

Battery cells and their defects are difficult to analyze non-destructively, and consequently, many defects and failures remain little noticed and little characterized until they cause grave damage. The measurement of the current density distributions inside a battery could reveal information about ideal cell behavior and its deviations from it, and could thus provide early signs of deterioration or failures. A method for fast nondestructive assessment and visualization of the effects of current distributions inside Li-ion pouch cells is described. The technique, based on magnetic resonance imaging (MRI), allows measuring the magnetic field maps during both charging and discharging. Marked changes in the distributions can be observed as a function of the state of charge, and also upon sustaining damage. The current distribution can be non-linear with overall charge and discharge current. The current distribution can be asymmetric with respect to switching the sign of the current. There can be a qualitative symmetry between full charge and full discharge. This technique could potentially be of great utility in diagnosing the health of cells and their behavior under different charging or environmental conditions.

Battery cells are central to the electrification of transportation, alternative energy use, and portable electronics. Demands on capacity and safety are often difficult to reconcile but remain key considerations in any battery implementation. There exist very few non-destructive measurement techniques which provide reliable information from within the cells. The MRI-based indirect method shown here provides a fast nondestructive technique for assessing the flow of current in the cells under different conditions and shows promise for detecting and localizing failures as well.

Nondestructive battery cell testing is of importance in employing rechargeable batteries in portable devices, transportation, and in energy storage grids. The accurate prediction of cell and battery lifetime and their capacity fading is of intense interest in many parts of a battery's deployment cycle. There is a lack of fast nondestructive techniques that can provide detailed and localized diagnostic data for fully assembled cells. An MRI-based technique that can provide an assessment of current distributions within cells quickly, which is also compatible with many commercial cell designs, is provided.

The current distribution within cells is affected by the design and resistance profile of each part of the cell, the heterogeneity of the electrodes, and the type and location of any physical defects such as dendrites or pre-existing cracks (see Baker, D. R. & Verbrugge, M. W. Temperature and Current Distribution in Thin-Film Batteries. *J. Electrochem. Soc.* 146, 2413-2424 (1999), the entire contents of which is hereby incorporated by reference). Non-uniform current distributions can be the source of cell failures or capacity loss, often initiated and accompanied by Lithium dendrite growth, or assembly imperfections. For example, it was shown that there was a direct correlation between energy density and the non-uniformity of the current distribution, demonstrating a potential to gain as much as 50% in energy density through improving the current distribution (see Zhang, G., Shaffer, C. E., Wang, C.-Y. & Rahn, C. D. Effects of Non-Uniform Current Distribution on Energy Density of Li-Ion Cells. *J. Electrochem. Soc.* 160, A2299-A2305 (2013), the entire contents of which is hereby incorporated by reference). Prior work on measuring current distributions include studies with cell hardware modifications. For example, the implementation of tabs in different positions along the electrodes provided a means of inferring the variability of current (see Samba, A. et al. Impact of Tab Location on Large Format Lithium-Ion Pouch Cell Based on Fully Coupled Tree-Dimensional Electrochemical-Thermal Modeling. *Electrochimica Acta* 147, 319-329 (2014) and Zhang, G., Shaffer, C. E., Wang, C.-Y. & Rahn, C. D. In-Situ Measurement of Current Distribution in a Li-Ion Cell. *J. Electrochem. Soc.* 160, A610-A615 (2013), the entire contents of which are hereby incorporated by reference), which demonstrated the significant changes evident in the current, depending on the charge/discharge rate. It is therefore of great interest to perform in situ or operando, non-invasive, and spatially-resolved measurements of current distributions, as it can pave the way for developing safer and higher performance batteries.

Experimental

Stacked electrode Li-ion pouch cells were used for imaging. Multilayer stacked electrode cells were manufactured as described in Ilott, A. J., Mohammadi, M., Schauerman, C. M., Ganter, M. J. & Jerschow, A. Rechargeable lithium-ion cell state of charge and defect detection by in-situ inside-out magnetic resonance imaging. *Nat. Commun.* 9, 1776 (2018) at the MT battery prototyping center with a capacity of 250 mAh and a nominal voltage of 3.7 V. The material that were used for the cell construction were $Li_{1.02}Ni_{0.50}Mn_{0.29}Co_{0.19}O_2$ as the cathode, Graphite as the anode and 1.2 M $LiPF_6$ EC:DMC 3:7 as the electrolyte. For increasing the conductivity and structure of working electrodes, Powder grade carbon black and PVDF were used.

Cylindrical holders with 39-mm diameter were designed in Tinkercad and 3D printed with a PLA filament. The holders were filled with a 15 mM $CuSO_4$ solution in water, giving a $^1H$ $T_1$ relaxation constant of 100 ms.

In order to fully charge cells (up to voltage 4.2V), cells were first charged with a current of 25 mA (0.1 C). Then, for each step of SOC, RIT cells were discharged with 125 mA (0.5 C) until the cell reached 2.5V. Cells were always operated between 4.2V and 2.5V. During current imaging, the cell was charging and discharging with a constant current protocol using a Biologic VSP potentiostat. The cycler remained connected to the cell throughout all measurements. An aluminum foil and an in-line low-pass filter with cutoff frequency of 1.9 MHz were used to shield the probe area from rf interference.

A 9.4T Bruker Ultrashield Avance I spectrometer with a Bruker mini0.75 gradient assembly was used for performing the Mill experiments. The resonance frequency of $^1H$ in the spectrometer was 400.1 MHz. For imaging and data collection, a Bruker MiniWB57 imaging probe was used with a Bruker WB57 40-mm i.d. coil insert for 41 experiments. A slice selective 2D FLASH sequence with nominal flip angle ($\alpha$) of 15°, TR of 100 ms, 12 scans of averaging, and four different echo times of 2.45, 2.5, 2.75, and 2.80 ms were used to acquire the 2D $^1H$ images. The readout direction was along z while x was the phase-encoded dimension and 128 points were collected along each dimension. The field of view (FOV) was 51.2 mm in the x and z-direction, which resulted in a 400 μm resolution. The slice thickness was 1 mm. Each 2D experiment took approximately 2.5 min.

Finite Element calculations were performed with COMSOL Multiphysics with the AC/DC module. A stacked-electrode cell and one jelly-rolled cell model were created in COMSOL (a calculation for a jelly-rolled cell yielded similar results). The calculation utilized the AC/DC module and solved Ampere's Law with current conservation boundary conditions.

The model of the stacked-cut electrode battery was composed of two single-sided coated anodes, one double-sided coated cathode, two aluminum current collectors, one copper current collector and three tabs for positive and negative ports. A mesh of 11,930,062 elements was used for finite element analysis. In the simulation of the charging/discharging condition, the copper tab of the battery was assigned as the positive/negative constant current terminal and the aluminum tabs were always grounded.

Results

Cells were placed in a slot in a custom-designed holder, containing compartments for water. For the measurements reported here a 15 mM CuSO4 water solution was used as the detection medium in order to shorten the $T_1$ relaxation time constant and thus allow faster imaging. The arrangement used is illustrated in FIG. 1A. The MM signals were obtained from the water compartment and all represented images in this article originated from a slice mid-way across the cell as indicated in FIG. 14(A). The measurement was based on a slice-selective FLASH imaging sequence, with different echo times. The different echo times allowed encoding the precession angles, from which the local precession frequency could be obtained accurately. After phase unwrapping, magnetic field images were produced. Only currents perpendicular to the static magnetic field led to observable fields, as the spin precession is only significantly affected by magnetic field components collinear with $B_0$. The orientations of the different coordinate axes are indicated in FIG. 14(B).

FIG. 14(C) shows the results from a current distribution calculation, considering an ideal rectangular electrode assembly and negligible effects from non-uniform charge states. The current pattern for both the positive and negative electrodes looks the same in this calculation, except that the polarity is reversed. The current distribution resembles those previously determined by theoretical and computational means as described in Taheri, P., Mansouri, A., Yazdanpour, M. & Bahrami, M. Theoretical Analysis of Potential and Current Distributions in Planar Electrodes of Lithium-ion Batteries. *Electrochimica Acta* 133, 197-208 (2014).

Figure 15:
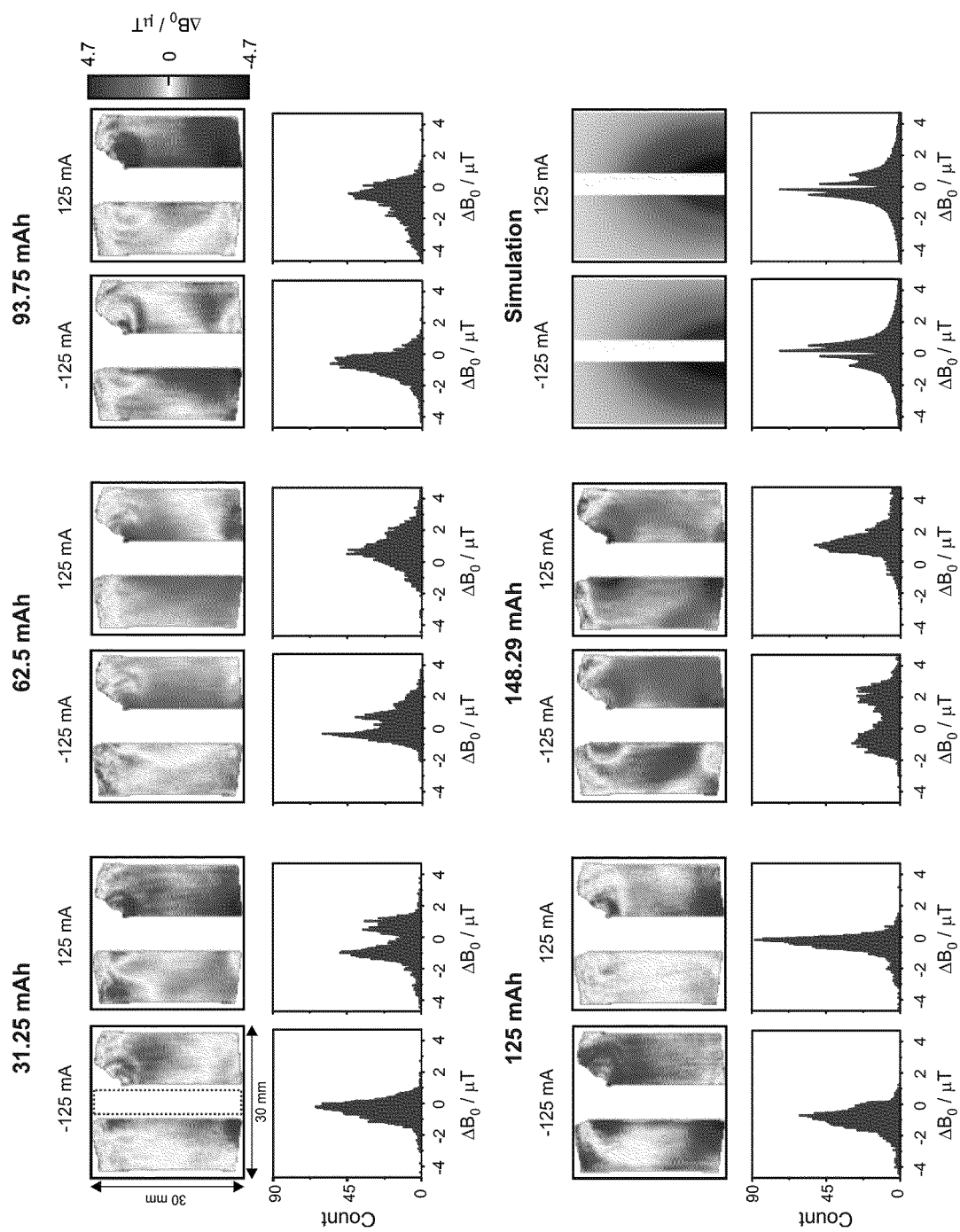
FIG. 15 illustrates magnetic field maps and histograms during discharge and charge at different states of discharge.

To explore the effect of the SOC on the current distribution, a cell made with 5 stacked double-coated cathode/anode layers, was first fully charged to 4.2 V, and then measured after discharging it by the specific amounts shown in FIG. 15. The measurements were performed while either discharge or charge current was applied around the indicated state of discharge (SOD). From each obtained field map, a resting-state reference image at the same SOD was subtracted. It is seen that a significant change in the current-produced magnetic fields is observed at the different SOD for both charge and discharge current.

Generally, the highest fields observed are near the tab. As the SOD increases, maxima develop in other locations, in particular also at the opposite end (top of the cell). This aspect is particularly interesting, as this phenomenon is related to a nonuniformity in SOC across the cathode. As the cathode material is enriched with Lithium more and more, the magnetic susceptibility increases and the effect on the magnetic field increases as well. It is seen that 'hot spots' shown in FIG. 15 indicate that current flow is correlated with areas of highest susceptibility and thus areas of highest SOD.

It is of note that there is no symmetry between maps for charge and discharge current at the same SOD, i.e. current is not simply reversed. For example, at low SOD (near full charge), there is only a small fraction of active material that is able to accept the charge, and it is much more dispersed, while during the discharge operation, current can be drawn from most charged areas. A similarly large asymmetry is observed for the highest SOD case: in this situation, during discharge, there are few areas that can produce current easily from the stored charge, while there are many more areas that can accept current during charging.

The two extreme cases, high and low SOD, however, observe an interesting symmetry when considered together. In the magnetic field histograms (FIG. 15) for the lowest SOD, one can see only one single peak in the negative range for the field from discharge current and two peaks (positive/negative) for charge current. For the highest SOD, the situation is reversed: a single peak is observed in the positive field range for charge current and two peaks for discharge current. With regard to the difference between a single peak or a double peak, one can provide the following explanation: Considering that a more or less uniform current is flowing along the y-direction, one would expect the magnetic field to be positive on one side of the cell and negative on the other, which would generate a double-peaked distribution. At low SOD, during charging, current is only weakly perturbed by the influence of active material, because the majority of the material is saturated. A similar situation is encountered for high SOD during discharge current—little active material is available to provide strong non-uniform perturbations in the current. Hence, in these two situations, one would expect a double-peaked distribution, centered around zero field, as was indeed observed.

A simulation was performed in order to explore this last point: the calculation was performed in a cell model while neglecting the contribution of active material. The result is shown in the bottom right panel of FIG. 15. The calculation shows the clear emergence of a double peak. The magnetic field range predicted is also in the same numerical range as shown in the experiments. The inner sharp peaks arise from areas further away from the cell, which may not be included in the experiment. Furthermore, the histogram also shows significant areas of very high positive and negative fields. These areas correspond to regions that are very close to the cell and may result in signal cancellation due to partial volume effects, and would thus not be observable in the experiment. Further minor differences may be due to the fact that the simulation did not incorporate any SOC inhomogeneities. Overall, there is hence a good conceptual agreement between this model calculation and the experiments in the regimes described above (at maximum and minimum SOD).

FIG. 15 illustrates magnetic field maps and histograms during discharge (negative current) and charge (positive current) at different states of discharge (SOD) as indicated. The bottom right panel shows a simulation. The battery leads in these measurements are located at the bottom of each map. The discharge capacity is indicative of the starting point of each step, and discharge measurements were performed before charge measurements. The imaging dimensions and the location of the cell (dotted rectangle) are indicated in the top left image.

Figure 16:
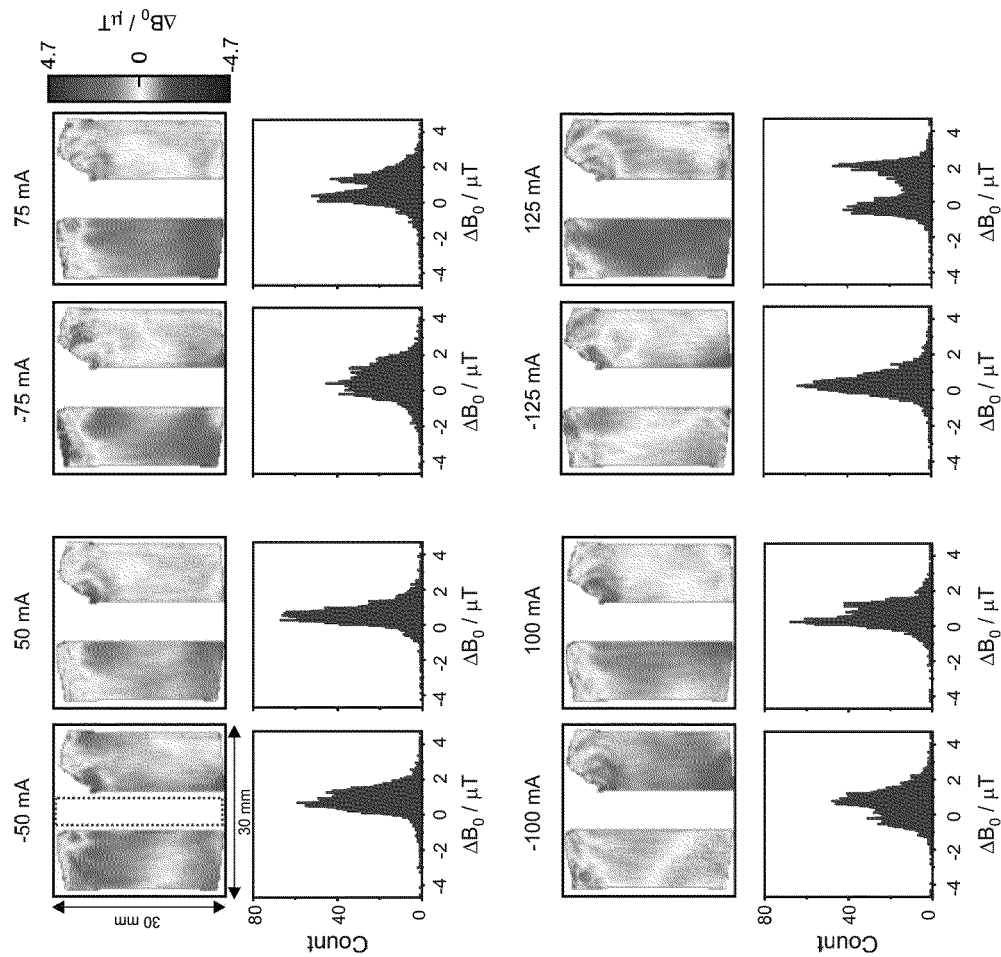
FIG. 16 illustrates magnetic field maps and histograms as a function of overall discharge and charge current near full charge.

FIG. 16 illustrates magnetic field maps and histograms as a function of overall discharge/charge current near full charge (SOD=0 mAh). The imaging dimensions and the location of the cell (dotted rectangle) are indicated in the top left image. In order to investigate the effect of current further, experiments were performed at full SOC (i.e. SOD=0 mAh) with different overall currents used for discharge and charge operation. The histogram shows that the double-peak pattern develops only above a certain threshold current (75 mA), is strongest at 125 mA, and remains absent for negative current (discharging), which is in line with the discussion in relation to FIG. 15. This effect could be rationalized by considering that a smaller current is affected more by perturbations from the active material.

Figure 17:
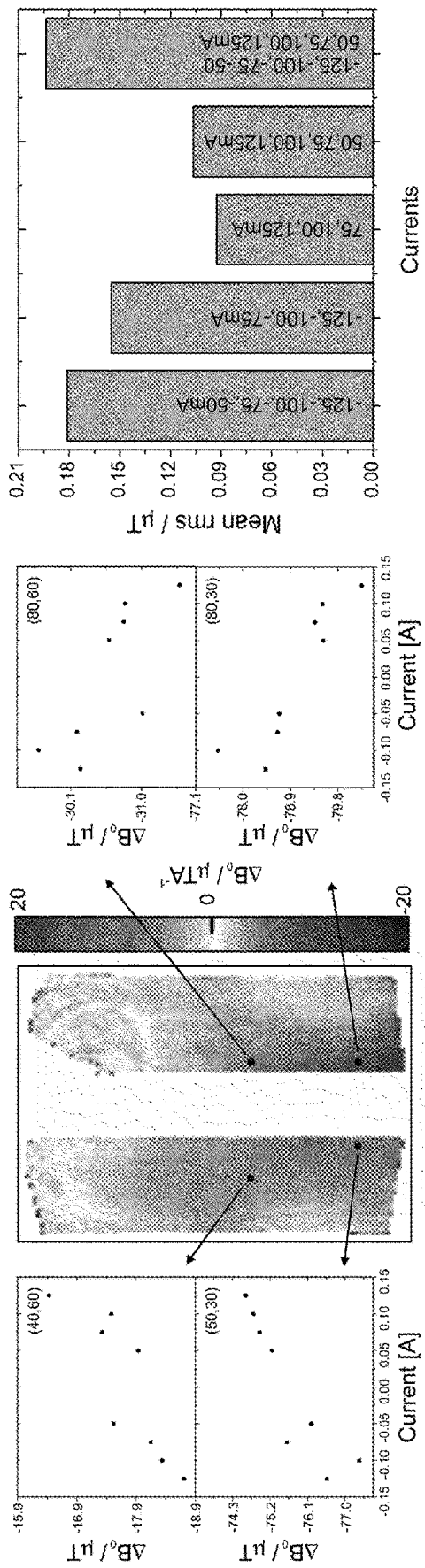
FIG. 17(A) illustrates a spatially resolved map of a linear per-voxel fit of magnetic field vs. current.
FIG. 17(B) illustrates the root mean square deviation of the linear fits across a whole volume performed by using different data combinations.

FIG. 17(A) illustrates spatially resolved map showing the result of a linear per-voxel fit of magnetic field vs. current, using all the current regimes measured (−125, −100, −75, −50, 50, 75, 100, 125 mA). Several points are extracted for illustration, showing the magnetic field vs. current at each location. FIG. 17(B) illustrates the root mean square deviation of the linear fits across the whole volume performed by using different data combinations as indicated.

In order to further examine the regimes of linearity of field vs. applied current, an analysis was performed to fit a linear model on a voxel-by-voxel basis to the magnetic field produced as a function of overall applied current. FIG. 17(A) shows the results for the slope (field per unit current) if the maps obtained for all currents (positive and negative) are used for the fit. Examination of this map indicated that there were marked non-linearities in many data points as demonstrated in the selection shown in FIG. 17(A). These illustrate a significant deviation from linearity, especially in the negative current regime. In order to provide a quantitative test for overall linearity, different combinations of maps were used for the fit, and the average root-mean-square deviation in the linear fit for each pixel was calculated across the whole measurement volume (FIG. 17(B)). It is seen that the deviation from linear behavior is largest if data from all measured current regimes are used. The largest deviation can be traced to originate from the negative current points (see the first two bars in FIG. 17(B), which have similarly high root-mean-square deviation values). The smallest deviation was found when only the three highest current regimes were used, and it was only slightly larger if the 50 mA point was included. This finding highlights the significant deviation from linear behavior for the discharge regime. This result is in line with earlier arguments that near full SOC, the discharge current experiences significant contributions from the active material, whereby the current distribution would be significantly altered. During charge, however, current flows more uniformly, and the active material does not produce significant inhomogeneities in the measurement. Measuring internal characteristics of a conducting structure can occur in the presence of electrical current flow. Indirectly measuring internal characteristics of a conducting structure can occur in the present of electrical current flow. The method of diagnosing a conducting structure can include extracting properties of current distributions. For example, the method can include extracting magnetic field histograms, which can be indicative of the effect of electrical currents internal to the battery. The method can include extracting information on the inner workings of battery cells and defects of battery cells.

Figure 18:
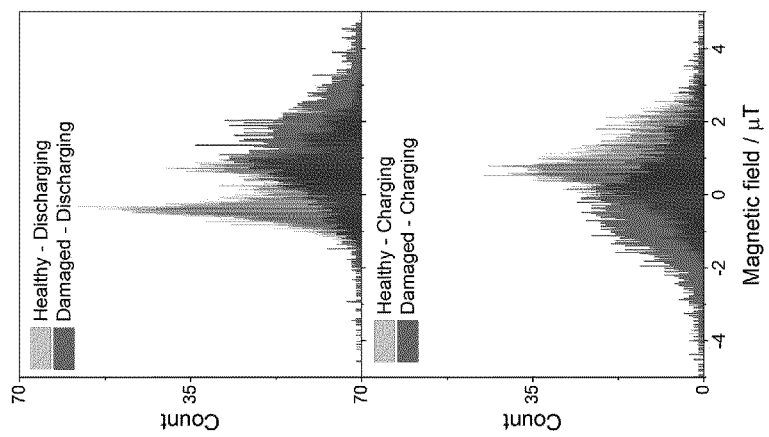
FIG. 18 illustrates histograms calculated from the magnetic field maps during discharging and charging.

FIG. 18 illustrates histograms calculated from the magnetic field maps during discharging and charging for a damaged cell at 62.5 mAh SOD (after subtracting a reference image in the resting state). it is demonstrated that the current distribution is significantly altered when a cell is damaged. FIG. 18 shows the magnetic field histograms after damaging the cell by dropping a 245 gram rod, with 1 cm diameter from a height of 30 cm, resulting in an energy released per unit area of 9175.79 J/m2. The damage led to significant changes in the current distribution, as is observed in FIG. 18.

An MRI-based technique for the nondestructive assessment of current distributions within rechargeable Li-ion cells is disclosed. The technique, based on an "inside-out" MRI approach (ioMRI), revealed an asymmetry in the current distributions between charging and discharging, which evolved as a function of SOC. The behavior near full SOC during charge operation and at high SOD during discharge operation demonstrated a notable similarity, which is indicative of less localized and less pronounced perturbations from the active material. Furthermore, it was found that the observed magnetic field distribution was nonlinear with respect to overall applied current (for example, it was most linear for charging near full charge and least linear for discharging in this state). Damages to the cell showed marked changes in current distributions as well. This measurement methodology shows promise for quick noninvasive assessment of cell behavior during charging and discharging and for determining the evolution of cell behavior.

Distortion-Free "Inside-Out" Imaging for Rapid Diagnostics of Rechargeable Li-Ion Cells The potential safety risks associated with modern high energy-dense rechargeable batteries highlight the need for advanced battery screening technologies. A common rechargeable cell exposed to a uniform magnetic field creates a pattern of magnetic field perturbation due to the inherent magnetism of the battery materials and components. This effect depends on the battery design, state of charge, and accumulated mechanical defects and history of the cell. The visualization of this induced magnetic field by means of MRI allows rapid non-invasive testing of commercial-type batteries. Here we introduce a quantitative distortion-free approach for battery diagnostics based on magnetic field mapping with Single Point Ramped Imaging with T1 enhancement (SPRITE). This method avoids image perturbations arising to background magnetic field gradients and eddy currents. The method is demonstrated on commercial Li-ion pouch cells and iPhone-5™ batteries. SPRITE is particularly suitable for cell diagnostics due to its robustness to artifacts in regions with large local field variations. The method is demonstrated to show superior image quality and sensitivity to defects and state of charge in batteries with strongly magnetic components.

Single point ramped imaging with T1 enhancement is a pure phase encoding technique. In the present disclosure, a SPRITE-based magnetic field (MF) mapping technique is implemented to perform ioMRI on rechargeable battery cells. The SPRITE-ioMRI approach provides accurate artifact-free MF visualization, especially in regions with strong local magnetism. Strongly magnetic materials are often incorporated into many commercial cells, making this SPRITE-ioMRI approach particularly useful. It is demonstrated that the state of charge (SOC) can be determined and defects can be localized with high accuracy with this SPRITE-ioMRI approach. The magnetic fields around battery cells are measured with a modified SPRITE sequence to obtain magnetic field maps. The SPRITE sequence can minimize image distortions and minimize Eddy currents due to smooth pulsed field gradient switching. The SPRITE sequence can be more non-invasive than the described FLASH sequence. Consequently, using the SPRITE sequence can allow for the measurement of batteries and objects that contain moderately strongly magnetic components, as well as reduce image artifacts and distortions.

FIG. 19(A) illustrates transverse {x-y} and longitudinal {x-z} views of the battery holder with respect to B0 and B1 field directions. FIG. 19(B) illustrates sectoral k-space trajectories with centric ordering employed in 3D-SPRITE. The kX-kY plane is divided into 8 sectors. This scheme is repeated for a number of equally spaced kZ values. FIG. 19(A) shows the arrangement of the cell and detection volumes. In the approach described previously by Ilott et al. (see Ilott A J, Mohammadi M, Schauerman C M, Ganter M J, Jerschow A (2018) Rechargeable lithium-ion cell state of charge and defect detection by in-situ inside-out magnetic resonance imaging. Nat Comm 9:1776.), the cell is placed inside the dedicated battery holder, and a series of fast image acquisitions (based on the FLASH method) were acquired with different echo times. The magnetic field maps were produced from fitting the signal phase as a function of echo time, in combination with a suitable phase unwrapping algorithm. In the presence of strong local magnetic field gradients (transient or permanent), several complications arise: (a) Signals in the vicinity of such features can decay rapidly due to destructive interferences within the voxels, and (b) strong background gradients lead to image misregistration in the frequency encoded dimension. Both these problems are addressed here with a modified SPRITE protocol, which minimizes signal evolution. Furthermore, because the method represents a fully phase-encoded acquisition, the compromising effects of any internal field gradients during image acquisition are avoided.

A centrically ordered SPRITE scheme (see Romanenko K, Forsyth M, O'Dell L A (2014) New opportunities for quantitative and time efficient 3D MM of liquid and solid electrochemical cell components: Sectoral Fast Spin Echo and SPRITE. *J Magn Reson* 248:96-104 and Halse M, et al. (2004) Centric scan SPRITE magnetic resonance imaging: optimization of SNR, resolution, and relaxation time mapping. *J Magn Reson* 169:102-117) is used here. The sequence starts at the k-space origin with a low flip angle hard RF pulse. The imaging gradient vector follows sectoral trajectories illustrated in FIG. 19(B). The advantages of this ordering are isotopically distributed image blurring arising from the repetitive RF pulses, pure T2* contrast, and the flexibility of control over the gradient and RF duty cycles. The free induction decay (FID) measured in a voxel at position R a time TP after the excitation is described by $$I_R(T_{Pp}) = \rho(R) V \exp(i\varphi(R) - T_P/T_2^*) \sin(\alpha), \quad \text{(Equation 2)}$$

where ρ(R) is the local spin density, V is the voxel volume, $\varphi(R) = 2\pi v(R)T_P$ is the phase accumulated due to free precession over the time $T_P$, and the excitation flip angle, a, is determined by the product of the RF field amplitude ($B_1$) and the RF pulse duration. $T_2^*$ is the time constant describing the rate of magnetization dephasing:

$$1/T2^* = 1/T2 + \Delta v, \quad \text{(Equation 3)}$$

where $T_2$ is the local spin-spin relaxation time constant, and Δv is the spread of Larmor frequencies within a voxel. By measuring the signal phase φ(R) as a function of time $T_P$ one can determine the local average Larmor frequency v(R) to within multiples of $(2\pi\Delta T_P)^{-1}$. The ambiguity arises from potential phase wrapping (by multiples of 2π). Unwrapped phases can be obtained by established procedures (28). Assuming that the phases are unwrapped, the resulting Larmor frequency becomes $$v(R) = \Delta\varphi(R)(2\pi\Delta T_P)^{-1} \quad \text{(Equation 4)}$$

The sensitivity of the MF mapping experiment depends on the range, ΔTP, and increases with the number, NP, of phase encoding intervals, TP. The time required for a MF mapping experiment is ≈NP (N 3 TRF+N M 5T1).

On the other hand, several phase-encoded points can be acquired after each RF excitation in a single FID readout. Since the acquisition occurs in the presence of applied MF gradients, these FID points correspond to different FOVs, and the k-space should be processed using an established chirp Z-transform algorithm (see Halse M, et al. (2004) Centric scan SPRITE magnetic resonance imaging: optimization of SNR, resolution, and relaxation time mapping. J Magn Reson 169:102-117, the entire contents of which are hereby incorporated by reference). Thus, the MF map can be reconstructed from just one SPRITE scan (NP=1). The number of FID points and the sampling rate can be adjusted to enhance the quality of the measurement.

The MR signal's lifetime and the measurable phase is determined by the local NMR spectrum line-width, Δv, associated with T2*. MF inhomogeneity will manifest itself as a partial volume effect when its characteristic length-scale is smaller than the voxel size. Therefore, depending on the MF inhomogeneity length-scale, increasing the MM resolution may result in a longer local T2*. On the other hand, as the signal intensity is directly proportional to the voxel volume (Eq. (1)), the MM resolution is largely limited by the signal-to-noise ratio (SNR). An additional benefit of this "one scan" approach is the reduced phase dispersion, enabled by the smaller phase encoding delays possible. As a result, a higher accuracy of the measured average phase is achieved.

The MF imaging can be implemented as 1-, 2- or 3D dimensional SPRITE experiment. A 1D profile of 128 points would consume only 2 s. A 2D MF measurement (64×64) could be acquired within 25 seconds. A 3D MF mapping experiment (64×64×64) providing sub-millimeter resolution could be performed in under 12 minutes (full k-space). These SPRITE measurement times can be substantially reduced, depending on MM hardware limitations (maximum RF and gradient duty cycle) and the k-space sampling approach.

Typical echo times (TE) of GRE-based methods are well in excess of 1 ms, an order of magnitude longer than phase encoding intervals achievable in SPRITE (<0.1 ms). In voxels exhibiting a linewidth of γ ΔB0/2π, such that TP≤(γ ΔB0/2π)−1, the SPRITE signal loss due to intra-voxel dephasing of magnetization would be insignificant while the FLASH signal would be completely suppressed.

Furthermore, once significant intra-voxel averaging occurs, the field map derived from the overall phase measurement seizes to be accurate even before the signals decay. Importantly, SPRITE images are free from geometry distortions associated with the background MF gradients. These gradients overlapping with the frequency encoding gradients are a common cause of artifacts in GRE and spin-echo (SE) imaging.

FIG. 20(A) illustrates longitudinal {y-z} and {x-z} slices through the 3D FLASH image of the battery holder containing the intact iPhone™-5 battery. FIG. 20(B) illustrate {y-z} and {x-z} slices through the 3D FLASH MF map. The binary mask shows $H_2O$ containing regions. FIG. 20(C) illustrates the regions of MF map in (B) with SNR>3. FLASH TE range: 2.45-2.8 ms. The iPhone™-5 battery contains strongly paramagnetic as well as some ferromagnetic components. This situation could represent a "no go zone" for the conventional Mill methods employing frequency encoding and slice selective pulses. A 3D FLASH image of the holder containing the iPhone™-5 battery illustrates this point (FIG. 20(A)). The positions and orientations of the 3D image slices with respect to the battery are indicated in FIG. 19(A) with red {x-z} and blue {y-z} dashed lines. As described previously, due to the battery's size, the upper and lower halves were measured in separate experiments and the images were combined.

The image suffered from poor SNR (≈1-2) near the center and near the leads (bottom) due to short local T2*(≈0.1 ms). These domains are in the vicinity of strongly magnetic elements of the battery. The longitudinal slices through the FLASH-derived 3D MF map are shown in FIG. 20(B). The binary mask applied to this map was calculated from the 3D FLASH reference image of the empty holder. The mask zeroed the voxels that did not contain H2O (i.e. outside the holder and inside the battery compartment). The regions inside the holder that were severely affected by the susceptibility contrast, occupied a significant volume near the battery (FIG. 20(B)). FIG. 20(C) shows only "useful" voxels of the MF map (SNR>3) and hence illustrates the limited applicability of FLASH in this case.

FIG. 21(A) illustrates longitudinal {y-z} and {x-z} slices through the 3D SPRITE image of the battery holder containing the intact iPhone™-5 battery, $T_P$: 0.12 ms. FIG. 21(B) illustrates {y-z} and {x-z} slices through the 3D MF map reconstructed based on 8 FID points of a single SPRITE scan. The SPRITE k-space sampling parameters: N=64, M=8; $T_P$ range: 0.11-0.15 ms; ROIs: 53×90 mm. The binary mask shows $H_2O$ containing regions. FIG. 21(C) illustrates a schematic of the iPhone™ battery, {y-z} and {x-z} views, with current collector and the leads shown. The SPRITE density images (T2*-weighted) demonstrate their robustness against distortions (FIG. 21(A)). With TP=0.12 ms, a $T_2^*$-weighting effect was seen near the center. The SPRITE MF map, FIG. 21(B), showed well-defined patterns in the "difficult" regions that were not accessible to FLASH (FIG. 20(C)). Here, SPRITE detected a frequency range that was almost three times larger than that what was seen by FLASH.

The "8"-shaped feature near the center of FOV can be attributed to slightly ferromagnetic material inside the cell.

Upon disassembly, this material was found to be a part of a Ni-plated tab. The extent of the arrangement is shown in FIG. 21(C). Above the tip of the metal strip, the MF perturbation exceeds +20 ppm, while below the tip, MF drops below −20 ppm. At 9.4 T, a MF variation of 40 ppm over a 5 mm distance is equivalent to a MF gradient of 75 mT m−1.

FIG. 22(A) illustrates longitudinal slices {x-z} and {y-z} through the 3D SPRITE MF maps of the damaged iPhone™-5 batteries whereby a 4 mm hole was punched through the middle of the lower half of the battery and the leads were removed. FIG. 22(B) illustrates longitudinal slices {x-z} and {y-z} through the 3D SPRITE MF maps of the damaged iPhone™-5 batteries whereby a 16 mm hole was punched through the middle of the lower half of the battery and the top half of the current collector was removed, as indicated on the right. The 3D MF maps were reconstructed based on 8 FID points of a single SPRITE scan. The SPRITE k-space sampling parameters: N=64, M=8; TP range: 0.11-0.15 ms; ROIs: 53×90 mm. The binary mask shows H2O containing regions. FIG. 22(A) and FIG. 22(B) shows the MF maps of two damaged iPhone™ batteries. FIG. 22(A) shows an effect of a 4 mm diameter hole punched in the center of the lower half of the battery, as indicated on the right. The magnetic tab of this battery was cut and removed from location.

An effect of a 16 mm diameter hole is demonstrated in FIG. 22(B). The ferromagnetic metal strip was cut in half and the upper half was extracted. The image shows a striking MF pattern associated with the defect and the leads. Note, that the "8"-shaped MF pattern in FIG. 21(B), observed near the center of the intact battery disappeared. Instead, the high MF field "cloud" emerged at the tip of the remaining half of the metal strip. Similar patterns were seen for the two leads at the bottom.

Next, the sensitivity of the method to certain defect features is shown. FIG. 23(A) and FIG. 23(B) shows photographs of an intact PowerStream cell and the same cell after introducing mechanical damage, respectively. The defect at the center of the battery was produced by impacts with a metal cylinder of 10 mm diameter. Three impacts were applied to the same spot (0.79 cm2) with the energy of 1.2 J per impact and led to a highly visible imprint of a depth of approximately 0.5 mm. A bulge was formed on the opposite side of the battery. The cell voltage, however, was not affected by this damage.

MF maps of the intact (FIG. 23(C)—FLASH, FIG. 23(E)—SPRITE) and damaged (FIG. 23(D)—FLASH, FIG. 23(F)—SPRITE) PowerStream cells showed noticeable differences. The position and orientation of the {x-z} slice with respect to the cell are indicated in FIG. 1a. The MF perturbation by the intact cell was symmetrical and approached +25 ppm above and below (outside the FOV) the battery. The damaged battery (FIGS. 23(D) and 23(F)) exhibited noticeable asymmetry of MF. These changes are consistent with simulations of MF perturbations by "impressions" and "bulges" on the surface of paramagnetic objects (see Ilott A J, Mohammadi M, Chang H J, Grey C P, Jerschow A (2016) Real-time 3D imaging of microstructure growth in battery cells using indirect MRI. Proc Natl Acad Sci 113:10779-10784, the entire contents of which are hereby incorporated by reference). FLASH TE range: 2.45-2.8 ms. The SPRITE k-space sampling parameters: N=37, M=4; $T_P$ range: 0.1-0.33 ms; ROIs: 41×41 mm. The space occupied by the battery is indicated with the rectangle.

MF perturbations observed by FLASH and SPRITE were different in magnitude and morphology. According to the SPRITE measurements (FIGS. 23(E) and 23(F)) the MF increased by up to 6 ppm near the region of impact, while on the opposite side of the cell the field decreased by up to 2 ppm. Importantly, the FLASH MF values were found within a much narrower range of frequencies (from −4 to +8 ppm) as compared to the SPRITE data (from −10 to +25 ppm). Near the region of impact, the maximum change in MF detectable by FLASH was close to 1 ppm. The FLASH images were also affected by ripple-like artifacts near the battery due to susceptibility contrast.

Figure 24:
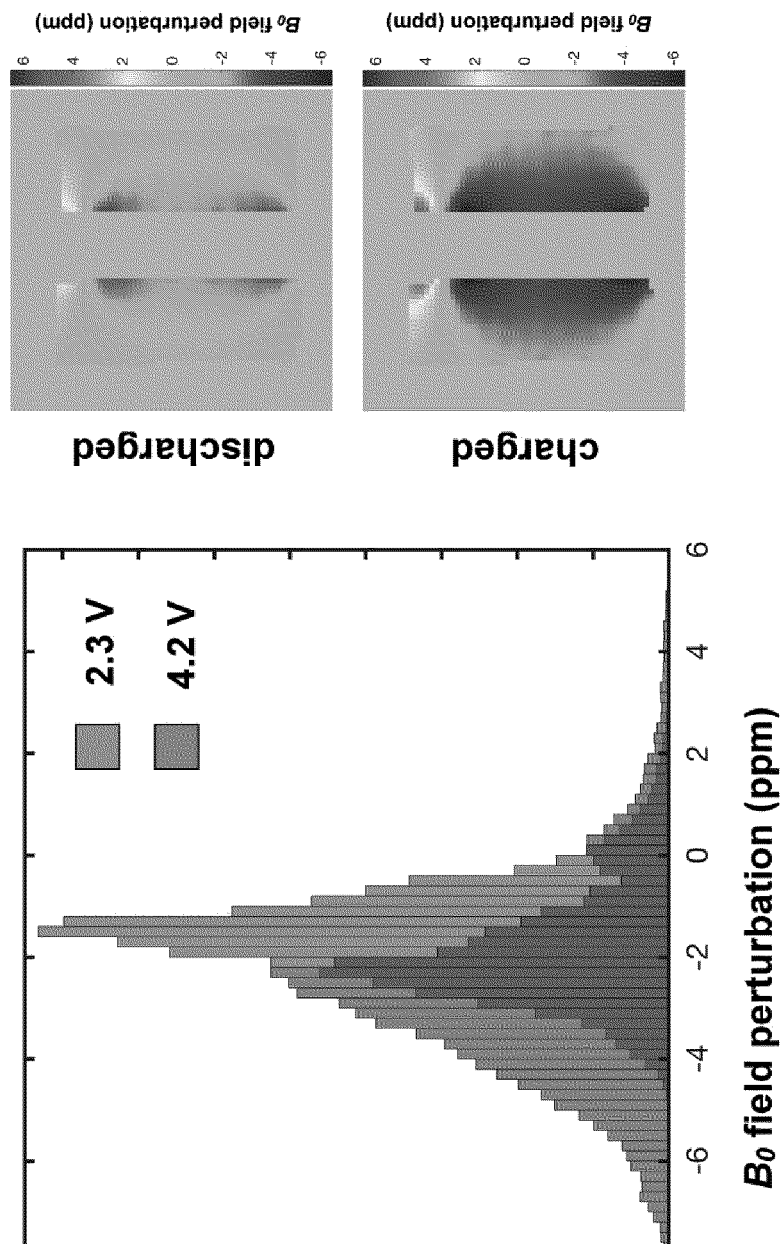
FIG. 24 illustrates the SOC effect on the magnetic susceptibility induced MF contrast. The histograms of MF distribution and {x-z} slices through MF maps are shown for discharged and charged PS battery.

FIG. 24 illustrates the SOC effect on the magnetic susceptibility induced MF contrast. The histograms of MF distribution and {x-z} slices through MF maps are shown for discharged and charged PS battery. The sensitivity of the new method to the SOC is disclosed. In the PowerStream batteries, the SOC-induced MF changes seen with FLASH approached 1.5 ppm·1 A much larger sensitivity of SPRITE to SOC is illustrated in FIG. 24. Charging the battery (500 mA h) resulted in up to a 4 ppm change in the local MF. The cathode chemistry and composition can determine the MF variations associated with SOC.

Paramagnetic electrodes and ferromagnetic metal components are common ingredients of the battery manufacturing process. The magnetic properties of battery constituents can be employed for non-destructive battery diagnostics by means of MM. A relationship between SOC and susceptibility provides a valuable source of MRI contrast in an "inside-out" MRI approach, which offers the opportunity of fast nondestructive diagnostics of cells. Pure phase encoding (3D) with short phase encoding times is a preferred approach in applications to systems exhibiting broad NMR lines. A combination of the "inside-out" MM (ioMRI) with SPRITE for accurate battery diagnostics is disclosed. The method is highly sensitive to mechanical defects and can distinguish fine changes in the electrode's chemical states and composition. The major benefit of SPRITE is the ability to accurately visualize the magnetic field around devices containing ferromagnetic components. In addition to the superior image quality, a high temporal resolution can be achieved, which is suitable for in situ battery characterization and commercial quality control applications.

MRI experiments were carried out using a Bruker Avance instrument equipped with a 9.4 T vertical 89 mm bore magnet (400.11 MHz 1H frequency), a Mini0.75 water-cooled triaxial gradient system driven by GREAT (¼0) amplifiers each providing 0.45 T m−1 maximum gradient. The RF excitation and 1H MRI signal detection were achieved with a 40 mm i.d. "bird cage" resonator (MiniWB57 probe). The SPRITE pulse sequence was programmed under the Bruker ParaVision5.2 environment.

An MR-compatible holder containing a battery and orientation of the holder with respect to B0 and B1 magnetic fields are illustrated in FIG. 19(A). The orientation of the battery was selected to maximize B1 homogeneity (9-11).

The following 3D SPRITE parameters were used: RF pulse duration, 4 μs; flip angle, π/40; gradient ramp time, 1 ms; gradient stabilization time, 0.9 ms; phase encoding time (TP) varied in the range from 70 to 360 μs; RF pulse repetition period, TRF≈2 ms; magnetization recovery delay between interleaves, 2 s; number of complex data points sampled per gradient step, 16; dwell time, 5 μs.

K-space sampling was performed using centrically ordered sectoral trajectories placed on the Cartesian grid.11 These trajectories were designed to fill a matrix of size N×N×N with M sectoral interleaves per x-y plane, FIG. 19(B). N planes were stacked along the z axis. An experiment {N=37, M=4} consumed 6.6 minutes with one signal average. The acquired k-space matrix 37×37×37 was zero-padded to 64×64×64. An experiment with {N=64, M=8} provided isotropic spatial resolution of 0.72 mm and consumed 26 minutes.

Image reconstruction and data processing were performed using Matlab™ (R2018b, The MathWorks, Inc.). SPRITE image reconstruction consisted of re-ordering the original complex data into a 3D k-space array based on predetermined 3D gradient tables. Since the imaging gradient vectors by design belong to the Cartesian grid, 3D Fourier transform of the re-ordered data directly results in a final 3D image.

A 3D MF map was reconstructed from a 4-dimensional data set acquired in a variable TP SPRITE experiment. The phase images were calculated from real and imaginary components of the SPRITE data. The Larmor frequency map was calculated by voxel-by-voxel linear regression of the temporal phase evolution, $v=\Delta\varphi(2\pi\Delta TP)-1$. The field-of-view (FOV) was fixed to a constant value by selecting the gradient waveform maxima Gj as follows: $Gj=2\pi N$ ($\gamma$ FOV TP j)−1. The MF map of the holder with the empty battery compartment was used as a reference. The reference image was measured independently and subtracted from the total MF map.

The rapid MF mapping approach based on one SPRITE scan used eight FID points per gradient step with a 5 μs dwell time. Each FID point resulted in one complex 3D phase image. The corresponding range of TP values was from 112-147 μs. The FOV of each image was scaled using a chirp Z-transform algorithm (22).

The FLASH protocol was a 3D sequence with linearly ordered phase encoding (Bruker ParaVision 5.2, echo time mode "Short_TE"). Acquisition of one isotropic image 128×128×128 consumed approximately 2.5 minutes. The gradient echo time (TE) varied in the range from 2.45 to 2.8 ms. MF maps were reconstructed from a series of four FLASH images.

Other Configurations

Figure 5:
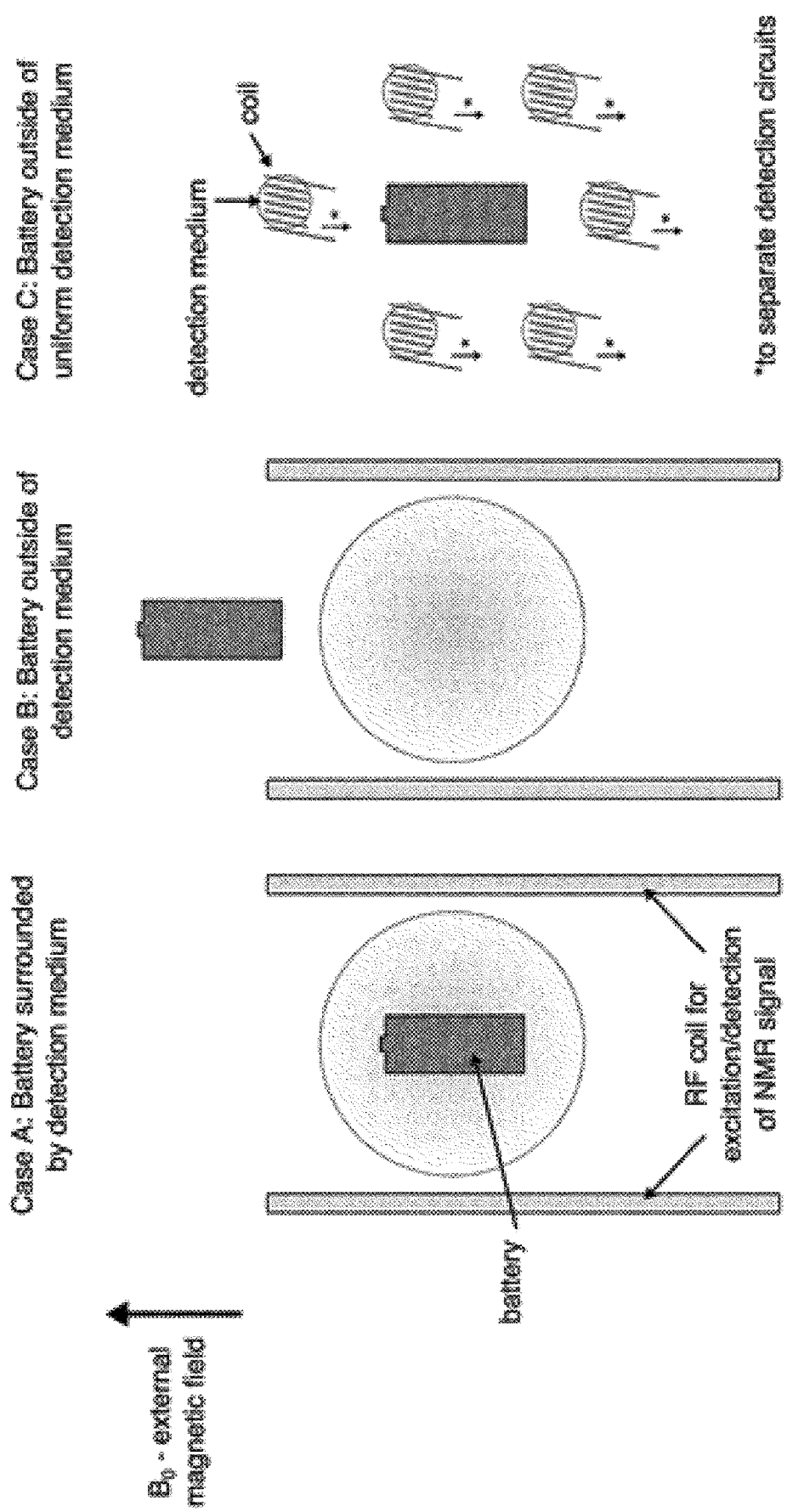
FIG. 5 illustrates an "in medium" setup, an "out of medium" setup, and a "spectroscopic" setup for indirectly diagnosing the health of a battery by characterizing a frequency distribution of a detection medium.

The above examples described an "inside-medium" setup (Case A of FIG. 5). In the "inside medium" setup, a container housing the conducting structure may be immersed in a detection medium. As used herein "immersed in a detection medium" may mean that the detection medium physically contacts the outer surface of the container or surrounds the outer surface of the container without physical contact. In another implementation, an "outside-medium" setup is used in which the detection medium is placed in a vicinity of the battery (Case B of FIG. 5) at a predetermined distance (e.g., several centimeters or less), depending on the size of holder containing the battery, and the container containing the detection medium. In this implementation, the experimental protocol will be identical to that of the "inside-medium" setup described above, using the same MRI and image processing methodology to recover a field map of the detection medium, only the calculations used to fit the battery magnetic susceptibility will differ to reflect the geometry of the "outside-medium" setup. In the outside-medium setup, the holder only contains the battery. The holder does not contain detection medium. Instead, the detection medium is housed in a separate container. It is preferable that the container containing the detection medium is placed as close as possible to the holder containing the battery, but if there are strong magnetic artifacts, the detection medium can be moved further away to minimize the artifacts and maximize the useful signal. The preferred maximum distance between the detection medium and the battery is a few cm, but in some cases, the container containing the detection medium could be large (e.g., 10-30 cm diameter), thereby increasing the maximum distance. The maximum distance between the conducting structure and the detection medium is roughly equal to the battery dimensions. The detection medium for the "outside-medium" setup has the same minimal requirements described in the examples above. The radiofrequency coil can be placed immediately around the detection medium, or a bigger radiofrequency coil can used which encompasses the whole volume including the battery. The sensitivity will be better when the radiofrequency coil is placed immediately around the detection medium.

In a third implementation referred to as a "spectroscopic" setup (see Case C of FIG. 5), the idea of the "outside medium" setup is extended. In particular, the "spectroscopic" setup includes multiple detection volumes (i.e., the detection medium is divided into a plurality of separate volumes), each encapsulated in a radiofrequency coil with separate detection circuits. In this implementation, the detection medium is restricted to small volumes (<1 cm$^3$), such that the field is uniform (<0.5 ppm variation) over the corresponding region. In this case, the measurement will consist of an NMR chemical shift spectrum (single pulse-acquire sequence) that will give a single estimate of $\Delta B_0$ in the vicinity of each detection medium that are distributed in 3D around the battery. By fixing the coordinates of each detection medium with respect to the battery position, $\Delta B_0$ (r), a finite region of the overall field map can be reconstructed and fit against a calculated susceptibility distribution in the same way as described for the imaged field maps. This method has the advantage of being much faster than the MRI-based techniques and can be performed without requiring MRI gradients.

Batteries are analyzed on the basis of changes in magnetic susceptibilities, a measure of the degree of magnetization of a material when a magnetic field is applied, and internal electric current distributions, which may change over the course of a charging/discharging cycle, and may be a result of battery degradation and failure. Either direct or alternating electrical current distributions can be measured. For the measurement of alternating current distributions, a pulse sequence can be used with pulse sequence elements, such as a radio-frequency pulse, which is modulated with the same frequency as the alternating electrical current. In this way, by analyzing phase-map images, one can obtain not only the magnitude of the current, but also the phase of the current. From this information, one can further obtain the localized distribution of impedances across the sample (i.e., the battery or the object of interest). The method can then be used to scan (in a localized way) the response of different parts of the object using different alternating electrical current frequencies. The inventors refer to this method as MR-based localized electrical impedance spectroscopy (MRLEIS).

The described susceptibility or electrical current measurements can be enhanced by (1) an inverse calculation of susceptibility maps or electrical current maps from the magnetic field maps using deconvolution or similar algorithms, and by (2) measuring magnetic field maps with the object oriented at different angles with respect to the static magnetic field. Both approaches can be combined. The orientation change is helpful for enhancing accuracy in the susceptibility or electrical current map calculations.

The properties leading to the observed magnetic field changes can be based on permanent or induced magnetic susceptibility, ferro-, para-, antiferro-, or diamagnetism, or electrical or ionic currents (direct or alternating current) within the object.

One particular embodiment may include electrochemical cells incorporated into a bigger device, such as a battery of several cells, or a cell or a battery incorporated into a device such as a cell phone, and the whole device could be analyzed in this fashion.

The systems and methods described in this specification use magnetic resonance to indirectly measure internal characteristics of a battery. By measuring the detection method, as opposed to the voltage and resistance/impedance of the battery itself, it is possible to evaluate the internal characteristics of any commercial battery of any geometry, including a commercial battery encased in conducting material. The method is fast and non-destructive. As discussed above, the lithiation state of cathodes, in particular, can be assessed at various stages in the charging cycle, although any overall susceptibility changes can be observed as well. Furthermore, it is possible to detect defects in cells, which could be determined even in unfinished cells (additional differences are observed between nominally non-defect cells). The methods described herein become particularly powerful if applied to large numbers of cells, where PCA or machine learning algorithms could operate on reduced data sets. Overall, the noninvasive methodology described herein enables faster progress in the development of new battery materials and cell designs that address current and future needs.

Implementations described in this specification can be implemented in digital electronic circuitry, or in computer software, firmware, or hardware, including the structures disclosed in this specification and their structural equivalents, or in combinations of one or more of them. The implementations described in this specification can be implemented as one or more computer programs, i.e., one or more modules of computer program instructions, encoded on one or more computer storage media for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium is both tangible and non-transitory.

Figure 6:
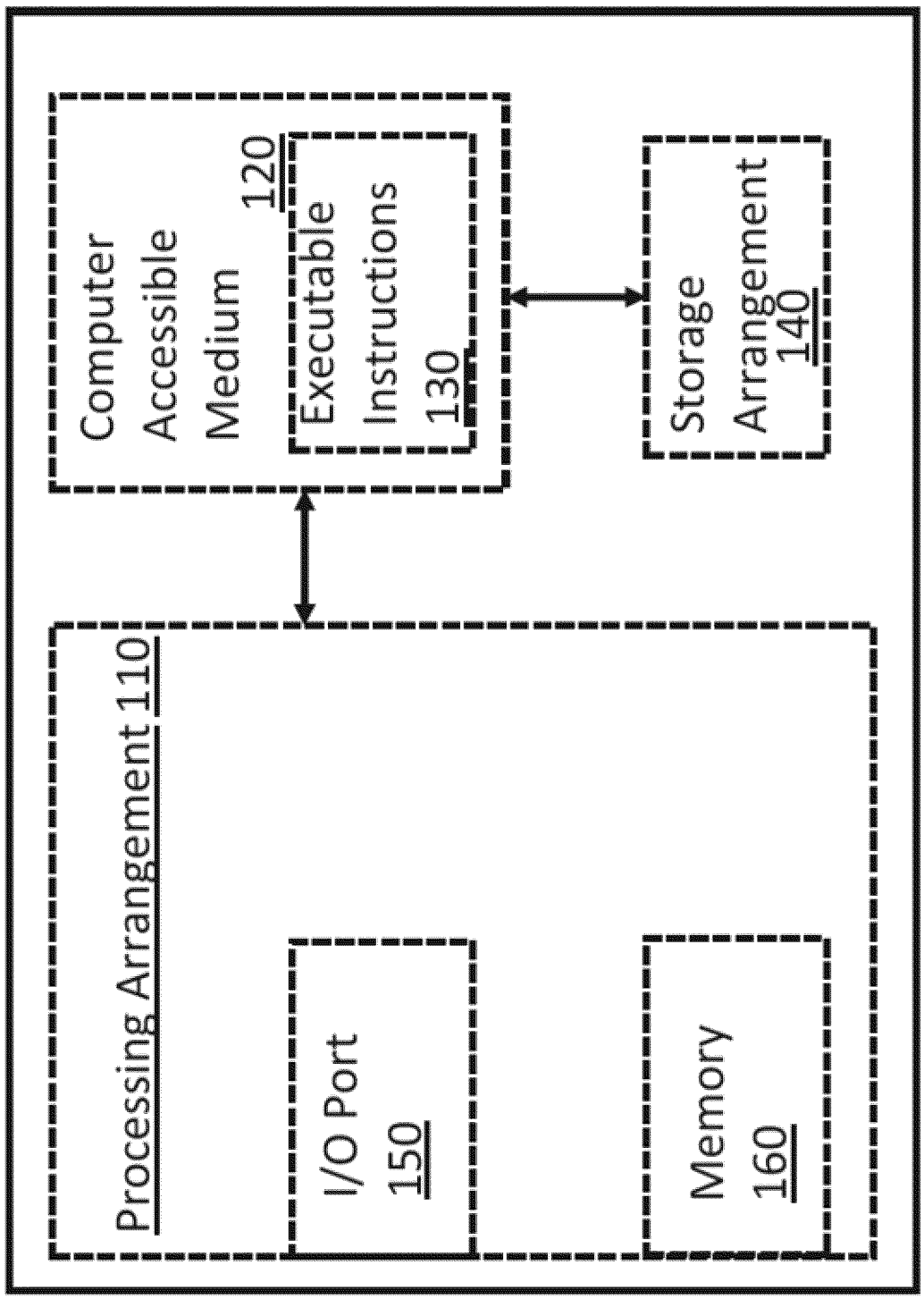
FIG. 6 illustrates one embodiment of a computer system for implementing an embodiment of the methods described herein.

As shown in FIG. 6, e.g., a computer-accessible medium 120 (e.g., as described herein, a storage device such as a hard disk, floppy disk, memory stick, CD-ROM, RAM, ROM, etc., or a collection thereof) can be provided (e.g., in communication with the processing arrangement 110). The computer-accessible medium 120 may be a non-transitory computer-accessible medium. The computer-accessible medium 120 can contain executable instructions 130 thereon. In addition or alternatively, a storage arrangement 140 can be provided separately from the computer-accessible medium 120, which can provide the instructions to the processing arrangement 110 so as to configure the processing arrangement to execute certain exemplary procedures, processes and methods, as described herein, for example.

The instructions may include a plurality of sets of instructions. For example, in some implementations, the instructions may include instructions for applying radio frequency energy in a plurality of sequence blocks to a volume, where each of the sequence blocks includes at least a first stage. The instructions may further include instructions for repeating the first stage successively until magnetization at a beginning of each of the sequence blocks is stable, instructions for concatenating a plurality of imaging segments, which correspond to the plurality of sequence blocks, into a single continuous imaging segment, and instructions for encoding at least one relaxation parameter into the single continuous imaging segment.

System 100 may also include a display or output device, an input device such as a key-board, mouse, touch screen or other input device, and may be connected to additional systems via a logical network. Many of the embodiments described herein may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Those skilled in the art can appreciate that such network computing environments can typically encompass many types of computer system configurations, including personal computers, hand-held devices, multi-processor systems, microprocessor-based or programmable consumer electronics, network PCs, mini-computers, mainframe computers, and the like. Embodiments of the invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

Various embodiments are described in the general context of method steps, which may be implemented in one embodiment by a program product including computer-executable instructions, such as program code, executed by computers in networked environments.

Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present invention could be accomplished with standard programming techniques with rule based logic and other logic to accomplish the various database searching steps, correlation steps, comparison steps and decision steps. It should also be noted that the words "component" and "module," as used herein and in the claims, are intended to encompass implementations using one or more lines of software code, and/or hardware implementations, and/or equipment for receiving manual inputs.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous. Thus, particular implementations of the invention have been described.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. Therefore, the above embodiments should not be taken as limiting the scope of the invention.

What is claimed:

1. A method of diagnosing a conducting structure, the method comprising:
    providing the conducting structure in a magnetic field;
    exciting nuclear or electronic spins within a detection medium using an electromagnetic signal having a first frequency;
    receiving an electromagnetic signal having a second frequency from the detection medium;
    obtaining a first distribution of frequencies of the detection medium at a first time and a second distribution of frequencies of the detection medium at a second time different from the first time, the detection medium external to the conducting structure and the first distribution of frequencies different from the second distribution of frequencies; and
    detecting frequency changes between the first distribution of frequencies of the detection medium and the second distribution of frequencies of the detection medium to obtain internal characteristics of the conducting structures;
    wherein the internal characteristics of the conducting structure are modeled on the basis of magnetic susceptibility differences and changes within the conducting structure, the modeling comprising:
    assigning one or more regions within the conducting structure a given magnetic susceptibility; and
    calculating a generated magnetic field based on an effect on the detection medium,
    wherein susceptibilities of the one or more regions form parameters configured to be fit by minimizing differences between a calculated frequency distribution and a measured frequency distribution in the detection medium.

2. The method of claim 1, wherein the conducting structure is a battery, a capacitor, a supercapacitor, or a fuel cell.

3. The method of claim 1, wherein the measurements are performed either during charging or discharging, either while current is flowing, or while current is stopped.

4. The method of claim 1, wherein
    the internal characteristic measured is a state of charge of the conducting structure; and
    the state of charge of the conducting structure is measured by converting the first distribution of frequencies of the detection medium into a state of charge.

5. The method of claim 1, wherein the conducting structure is a catalyst material.

6. The method of claim 1, wherein indirectly measuring internal characteristics of the conducting structure occurs in the presence of electrical current flow.

7. The method of claim 1, comprising extracting properties of current distributions.

8. The method of claim 1, wherein the method comprises immersing the container housing the conducting structure in the detection medium.

9. The method of claim 1, wherein the method comprises providing the detection medium at a predetermined distance from the conducting structure.

10. The method of claim 1, wherein the detection medium comprises water or water doped with a paramagnetic species.

11. The method of claim 1, wherein the method comprises measuring magnetic fields with Single Point Ramped Imaging with T1 Enhancement (SPRITE).

12. The method of claim 1, wherein the frequency changes are indirect measurements of the conducting structure.

13. A system for diagnosing internal characteristics of a conducting structure, the system comprising:
    an NMR/MRI magnet;
    at least one radiofrequency coil removably positioned within the NMR/MRI magnet;
    a holder configured to receive a conducting structure; and
    a detection medium,
    wherein internal characteristics of the conducting structure are obtained by obtaining a first distribution of frequencies of the detection medium at a first time and a second distribution of frequencies of the detection medium at a second time different from the first time, determining frequency changes between the first distribution of frequencies of the detection medium and the second distribution of frequencies of the detection medium by exciting nuclear or electronic spins within the detection medium using a first electromagnetic signal having a first frequency, receiving a second electromagnetic signal having a second frequency from the detection medium,
    wherein the detection medium is external to the conducting structure,
    wherein the first distribution of frequencies different from the second distribution of frequencies; and
    wherein the internal characteristics of the conducting structure are modeled on the basis of magnetic susceptibility differences and changes within the conducting structure, the modeling comprising:
    assigning one or more regions within the conducting structure a given magnetic susceptibility; and
    calculating a generated magnetic field based on an effect on the detection medium,
    wherein susceptibilities of the one or more regions form parameters configured to be fit by minimizing differences between a calculated frequency distribution and a measured frequency distribution in the detection medium.

14. The system of claim 13, wherein the holder comprises
    a first detection medium chamber configured to receive a volume of the detection medium;
    a second detection medium chamber configured to receive a volume of the detection medium; and
    a conducting structure chamber provided between the first detection medium chamber and the second detection medium chamber and configured to receive the conducting structure.

15. The system of claim 13, further comprising:
a plurality of containers arranged around the holder and a predetermined distance from the holder, each container housing a volume of a detection medium.

16. The system of claim 13, wherein the conducting structure comprises a battery, a capacitor, a supercapacitor, a fuel cell, or a catalyst material.

17. The system of claim 13, wherein the detection medium comprises water or water doped with a paramagnetic species.

18. A method of diagnosing a conducting structure, the method comprising:
providing the conducting structure in a magnetic field;
exciting nuclear or electronic spins within a detection medium using an electromagnetic signal having a first frequency;
receiving an electromagnetic signal having a second frequency from the detection medium;
obtaining a first distribution of frequencies of the detection medium at a first time and a second distribution of frequencies of the detection medium at a second time different from the first time, the detection medium external to the conducting structure and the first distribution of frequencies different from the second distribution of frequencies; and
detecting frequency changes between the first distribution of frequencies of the detection medium and the second distribution of frequencies of the detection medium to obtain internal characteristics of the conducting structure;
wherein the internal characteristics of the conducting structure are modeled on the basis of current distributions within the conducting structure, the modeling on the basis of current distributions within the conducting structure comprising:
assigning one or more regions within the conducting structure a given current distribution; and
calculating a generated magnetic field based on an effect on the detection medium,
wherein amplitudes of current distributions of the one or more regions form parameters configured to be fit by minimizing differences between a calculated frequency distribution and a measured frequency distribution in the detection medium.

* * * * *